United States Patent [19]
Sakakibara

[11] Patent Number: 6,048,770
[45] Date of Patent: Apr. 11, 2000

[54] NONVOLATILE SEMICONDUCTOR MEMORY DEVICE AND METHOD OF MANUFACTURING THE SAME

[75] Inventor: Kiyohiko Sakakibara, Hyogo, Japan

[73] Assignee: Mitsubishi Denki Kabushiki Kaisha, Tokyo, Japan

[21] Appl. No.: 08/924,881

[22] Filed: Sep. 5, 1997

Related U.S. Application Data

[62] Division of application No. 08/317,643, Sep. 30, 1994, Pat. No. 5,691,560.

[30] Foreign Application Priority Data

Jul. 19, 1994 [JP] Japan ..................... 6-166828

[51] Int. Cl.⁷ ................ H01L 21/336; H01L 21/8236
[52] U.S. Cl. .................... 438/291; 438/257; 438/276; 438/286
[58] Field of Search ................... 438/291, 257, 438/276, 286

[56] References Cited

U.S. PATENT DOCUMENTS

| | | |
|---|---|---|
| 4,868,619 | 9/1989 | Mukherjee et al. . |
| 4,939,558 | 7/1990 | Smayling et al. . |
| 5,422,506 | 6/1995 | Zamanian .................. 257/344 |
| 5,548,143 | 8/1996 | Lee ........................... 257/269 |

FOREIGN PATENT DOCUMENTS

| | | |
|---|---|---|
| 63-40377 | 2/1988 | Japan . |
| 63-300567 | 12/1988 | Japan . |
| 2-284473 | 11/1990 | Japan . |
| 3-66171 | 3/1991 | Japan . |
| 4-211178 | 8/1992 | Japan . |
| 5-114739 | 5/1993 | Japan . |

OTHER PUBLICATIONS

Wolf, S.; Silicon Processing for the VLSI Era, vol. 1; Lattice Press, Sunset Beach, Ca.; pp. 325–330, 1986.

*Primary Examiner*—John F. Niebling
*Assistant Examiner*—Neal Berezny
*Attorney, Agent, or Firm*—McDermott, Will & Emery

[57] ABSTRACT

Under an $N^-$-drain region covering an $N^+$-drain region, a $P^+$-impurity region is formed without covering an end of the $N^-$-drain region near a channel region. Thereby, the $P^+$-impurity region suppresses a punch-through phenomenon, while the $N^-$-drain region prevents a leak current due to interband tunneling.

2 Claims, 26 Drawing Sheets

SELECT GATE    8CELLS(BITS)

NONVOLATILE SEMICONDUCTOR MEMORY DEVICE AND METHOD OF MANUFACTURING THE SAME

This application is a division of application Ser. No. 08/317,643 filed Sept. 30, 1994, now U.S. Pat. No. 5,691,560.

BACKGROUND OF THE INVENTION

1. Field of the Invention

The present invention relates to a nonvolatile semiconductor memory device and a method of manufacturing the same, and in particular, relates to a nonvolatile semiconductor memory device which performs erasing by injecting electrons into a floating gate electrode, and a method of manufacturing the same.

2. Description of the Background Art

As one of nonvolatile semiconductor memory devices, there has been known an EEPROM (Electrically Erasable and Programmable Read Only Memory) allowing free programming of data and allowing electrical writing and erasing of information. Although the EEPROM has an advantage that both writing and erasing can be executed electrically, it requires two transistors for each memory cell, and therefore integration to a higher degree is difficult. By this reason, there has been proposed a flash EEPROM including memory cells, each of which is formed of one transistor, and allowing electrical entire chip erasing of written electric information charges. This is disclosed, for example, in U.S. Pat. No. 4,868,619.

Further, there has been proposed a flash EEPROM of a DINOR (Divided Bit Line NOR) type as a nonvolatile semiconductor memory device which can achieve all objects of the flash EEPROM, i.e., the low cost, low voltage and low power consumption, high-speed rewriting, sector erasing and high reliability. The cell of this DINOR type is formed by employing a main/sub-bit line structure in a conventional cell of the NOR type and adding a select gate thereto.

FIG. 19 is a cross section showing a flash EEPROM of the DINOR type which has been proposed. Referring to FIG. 19, a cell of the DINOR type is provided with memory cell transistors 110 corresponding to 8 bits (8 cells) with a predetermined space therebetween. There are also formed select transistors 103 adjacent to memory cell transistors 110. A sub-bit line 102 is electrically connected to memory cell transistors 110 corresponding to 8 bits.

A main bit line 101 is connected to select transistors 103. Word lines 104 spaced by a predetermined distance are formed above main bit line 101. In the cell of the DINOR type thus constructed, low voltage and low power consumption as well as high-speed rewriting can be achieved by changing an electron injection mechanism into F-N (Fowler-Nordheim) tunneling. The low cost and sector erasing are achieved by employment of the main/sub-bit line structure and addition of a select gate. A problem of drain disturb phenomenon during sector erasing does not arise at all owing to provision of the select gate. The operation speed is high as in the conventional device.

FIG. 20 is a cross section showing a conventional cell of the DINOR type. Referring to FIG. 20, the conventional cell of the DINOR type is provided at a main surface of a P-type semiconductor substrate 1 with an $N^+$-drain region 2 and an $N^+$-source region 3 which are spaced by a predetermined distance from each other with a channel region 50 therebetween. $N^+$-drain region 2 is covered with $N^-$-drain region 4. A floating gate electrode 9 is formed on channel region 50 with an insulating film 8 therebetween. A control gate electrode 11 is formed on floating gate 9 with an interlayer insulating film 10 therebetween.

FIGS. 21, 22, 24 and 26–30 are cross sections showing a process of manufacturing a memory cell portion and a peripheral circuit portion of the cell of the DINOR type shown in FIG. 20. FIG. 23 shows an impurity profile along line 100—100 in the manufacturing process shown in FIG. 22. FIG. 25 shows an impurity profile along line 200—200 in the manufacturing process shown in FIG. 24. Referring to FIGS. 21–30, description will be given on the memory cell portion and the peripheral circuit portion of the conventional cell of the DINOR type.

In the memory cell portion and peripheral circuit portion, as shown FIG. 21, a patterned $SiO_2$ film 16 and a patterned nitride film 17 are formed at a predetermined region on the main surface of P-type semiconductor substrate 1. Using $SiO_2$ film 16 and nitride film 17 as a mask, an element isolating oxide film 15 is formed by an LOCOS method. Thereafter, $SiO_2$ film 16 and nitride film 17 are removed.

Referring to FIG. 22, boron (B) ion is implanted into P-type semiconductor substrate 1 with the conditions of 120–200 keV and $2\times10^{12}$–$6\times10^{12}$ cm$^{-2}$. Thereby, a P-type channel stopper layer 18 is formed. Referring to FIG. 23, the impurity profile in the manufacturing process shown in FIG. 22 has a peak of impurity concentration of boron (B) at a predetermined depth from the surface of P-type semiconductor substrate 1.

As shown in FIG. 24, ion implantation is effected on both the memory cell portion and peripheral circuit portion, and specifically, boron is implanted into P-type semiconductor substrate 1 with the conditions of 35–50 keV and $1\times10^{12}$–$5\times10^{12}$ cm$^{-2}$ using element isolating oxide film 15 as a mask. Thereby, a channel doped layer 19 is formed. The impurity profile in this state presents a peak caused by channel doped layer 19 and a peak caused by channel stopper layer 18.

As shown in FIG. 26, an insulating film 8 made of a tunnel oxide film of about 100 Å in thickness is formed on the main surface of P-type semiconductor substrate 1 in the memory cell portion. A polycrystalline silicon layer (not shown), an ONO film (not shown) and a polycrystalline silicon layer (not shown) are successively formed on insulating film 8, and these layers are patterned to form control gate electrode 11 made of the polycrystalline silicon layer, interlayer insulating film 10 made of the ONO film and floating gate electrode 9 made of the polycrystalline silicon layer.

In the peripheral circuit portion, as shown in FIG. 27, a gate oxide film 30 is formed on the main surface of P-type semiconductor substrate 1. After forming a polycrystalline silicon layer on gate oxide film 30, the polycrystalline silicon layer is patterned to form a gate electrode 31. Gate electrode 31 in the peripheral circuit portion may be formed simultaneously with floating gate electrode 9 or control gate electrode 11 in the memory cell portion.

As shown in FIG. 28, a resist 20 is formed to cover a drain formation region in the memory cell portion. Using resist 20 and control gate electrode 11 as a mask, arsenic is ion-implanted into P-type semiconductor substrate 1 with 30–60 keV and $1\times10^{15}$–$8\times10^{15}$ cm$^{-2}$. Thereby, source region 3 is formed. Thereafter, resist 20 is removed.

As shown in FIG. 29, a resist 21 is formed to cover source region 3 in the memory cell portion. Using resist 21 and control gate electrode 11 as a mask, arsenic is ion-implanted into P-type semiconductor substrate 1 with the conditions of 30–60 keV and $1\times10^{15}$–$8\times10^{15}$ cm$^{-2}$, and then phosphorus (P) is ion-implanted into P-type semiconductor substrate 1 with the conditions of 30–60 keV and $1\times10^{13}$–$1\times10^{15}$ cm$^{-2}$. Thereby, N$^+$-drain region 2 and N$^-$-drain region 4 are formed. Thereafter, resist 21 is removed.

In the peripheral circuit portion, as shown in FIG. 30, N-type ion is implanted into P-type semiconductor substrate 1 using gate electrode 31 as a mask. Thereby, source/drain regions 32 and 33 of the peripheral circuit transistor are formed.

In this manner, the memory cell portion and peripheral circuit portion of the conventional DINOR type are formed.

The conventional cell of the DINOR type uses the F-N tunnel current for both writing and erasing. The cell of the DINOR type requires a device performing a single power supply operation. In order to perform writing and erasing with a single power supply of 5 V or 3.3 V, the device must be provided with a charge pump circuit for increasing the voltage. Due to provision of the charge pump circuit, the leak current which generates during writing and erasing in the memory cell must be set not to exceed the capacity of the charge pump circuit. The maximum drive capacity of the charge pump circuit depends on an area of the charge pump circuit, and is generally set to a value from about 200 to about 300 $\mu$A.

FIG. 31 schematically shows a cell array structure of the conventional flash EEPROM of the DINOR type. FIG. 32 schematically shows the write operation of the flash EEPROM of the DINOR type. In the DINOR type, referring to FIGS. 31 and 32, when writing is to be effected in connection with a certain word line (WLn), information relating to the memory cell, on which writing is to be effected, among memory cells on the word line in question is sent to a latch 150. At the writing step, a charge pump circuit 151 applies a bit line bias voltage (Vd=6 V) to the bit line containing the memory cell on which the writing is effected. Thereafter, a negative bias of –8 V is applied only to word line WLn, and programming is effected on the memory cell to be programmed on the word line WLn. At this state, 0 V has been applied to the other word lines.

In the above write operation, $V_D$=6 V is applied to the memory cells on the same bit line as the memory cell for the writing, i.e., memory cell on which the writing is performed. Thus, there exist 63 bits of nonselected cells, of which word line voltage (control gate voltage) is 0 V and bit line voltage (drain voltage) is 6 V, on the bit line on which the memory cell for the writing exists (see FIG. 32). This means that there exist up to 63×2K memory cells which are in the nonselected and erased state.

The leak current of such nonselected and erased memory cell will be discussed below. According to the DINOR type, the threshold voltage $V_{TH}$ in the erased state is set higher than the threshold voltage in the written state. Thus, in the erased state, the floating gate electrode has stored electrons. Assuming that $\Delta V_{TH}$ represents a rise of the threshold voltage in the erased state from that in the state that the floating gate has not stored electric charges, $V_D$ represents the voltage applied to the bit line in the write operation, $V_{CC}$ represents the voltage applied to the word line (control gate electrode), $\alpha_{CC}$ represents the capacitance ratio between the floating gate and control gate, and $\alpha_D$ represents the capacitance ratio between the floating gate and source region, the following formula (1) expresses a potential $V_{FG}$ of the floating gate in the nonselected and erased memory cell.

$$V_{FG} = -\alpha_{CC} \cdot \Delta V_{TH} + \alpha_D \cdot V_D + \alpha_{CC} \cdot V_{CC} \quad (1)$$

Assuming that $V_{TH}$ is 3 V, $V_D$ is 6 V, $V_{CC}$ is 0, $\alpha_{CC}$ is 0.6, and $\alpha_D$ is 0.1, the potential $V_{FG}$ of floating gate electrode goes to –1.2 V according to the above formula (1).

FIG. 33 shows a result obtained by measuring an interband tunnel current in the nonselected and erased memory cell using a memory cell which is adapted to allow direct adjustment of the potential of the floating gate electrode. The leak current was measured in the state that –1.2 V is applied to the floating gate electrode and 6 V is applied to the drain region. The interband tunnel current (leak current) was also measured with various values of the impurity concentration of N$^-$-drain region 4 shown in FIG. 20. Referring to FIG. 33, it can be found that the interband tunnel current (leak current) is $1\times10^{-8}$ A/cell if an N$^-$-drain region is not formed (i.e., if impurity concentration of N$^-$-drain region is 0). Since there exist up to 63×2K memory cells in the nonselected and erased state, the charge pump circuit 151 is required to have a capacity which can drive the current of $1\times10^{-8}\times63\times2K$= 1.26 mA.

However, the maximum current drive capacity of the charge pump circuit 151 is about 300 $\mu$A at the most as already described, and thus the above leak current exceeds the upper limit of the capacity of charge pump circuit 151. Assuming that the maximum allowable leak current of the nonselected and erased memory cell is 1/3 of the maximum capacity of the charge pump circuit, the allowable leak current per memory cell is 100 $\mu$A/(63×2K)=793 pA. Therefore, it can be understood that the leak current per memory cell must be less than about 800 pA.

In order to reduce the interband tunnel current (leak current), N$^-$-drain region 4 may be formed as shown in FIG. 20. As can be seen from FIG. 33, the interband tunnel current (leak current) decreases in accordance with increase of the impurity concentration of N$^-$-drain region. In order to set the leak current to a value not more than the allowable value of 800 pA, implantation of phosphorus must be performed to attain the impurity concentration of about $3\times10^{14}$ cm$^{-2}$.

In the prior art, however, a punch-through phenomenon occurs if N$^-$-drain region 4 is formed for preventing the interband tunnel current (leak current). The punch-through phenomenon is a phenomenon in which a depletion layer near the drain region spreads up to the source region so that the current cannot be controlled with the gate voltage. FIG. 34 shows punch-through characteristics in a memory cell of the conventional flash EEPROM. Referring to FIG. 34, if the gate length is about 0.6 $\mu$m, it is necessary to ensure the breakdown characteristics with the gate length of about 0.55 $\mu$m when actually forming the device, taking processing tolerance and others into consideration. More specifically, as shown in FIG. 34, the breakdown voltage not less than 6 V (i.e., not less than bias voltage in the write operation) must be ensured with the gate length of 0.55 mm. As can be seen from FIG. 34, if the impurity concentration of N$^-$-drain region is $3\times10^{14}$ cm$^{-2}$ (circular marks in the figure), it is difficult to ensure the above breakdown voltage (6 V). Thus, if the N$^-$-drain region is formed for reducing the interband tunnel current (leak current), the punch-through phenomenon is likely to occur, resulting in reduction of the drain breakdown voltage.

Further, in the flash memory of the DINOR type, there has been the demand for low cost. In order to meet the demand for low cost, it is necessary to employ common structures for the N-channel transistor in the peripheral circuit and the N-channel transistor in the memory cell region. In general, channel doping for the N-channel transistor in the peripheral circuit is performed by implanting boron with implantation energy of about 50 keV. However, if channel doping were performed on the memory cell transistor with the same implantation energy, the punch-through phenomenon would be likely to occur in the memory cell transistor provided with N⁻-drain region 4.

If implantation dose of impurity for the channel doping is increased in order to overcome the above problem, such a problem arises that the threshold voltage of peripheral transistor increases and the drain current decreases. If the implantation energy for channel doping is increased, such a problem arises that a substrate constant K at the peripheral transistor increases. Description will be given more in detail on the facts that the punch-through phenomenon is likely to generate if N⁻-drain region 4 is formed, and that the substrate constant K of peripheral transistor increases if the implantation energy increases.

FIG. 35 shows an impurity profile at the channel portion in the memory cell, and FIG. 36 shows an impurity profile at the drain portion in the memory cell. Referring to FIG. 35, a curve portion having a peak at about 0.14 $\mu$m from the substrate surface represents impurity distribution caused by the channel doping. A curve portion having a peak at about 0.37 $\mu$m represents impurity distribution in the channel stopper layer. It can be understood that the concentration of P-type impurity is low at about 0.22 $\mu$m from the substrate. If N⁻-drain region 4 is formed for the purpose of reducing the leak current of memory cell transistor, the punch-through phenomenon is likely to occur in a region at a depth of about 0.22 $\mu$m from the substrate, because the impurity concentration is low at this region. FIG. 37 shows punch-through characteristics in the case where the gate length of 0.4 $\mu$m is set in the memory cell transistor having the impurity profiles shown in FIGS. 35 and 36. It can be seen from FIG. 37 that a depletion layer spreads at a deep region of the substrate from the drain to the source if a potential of about 5 V is applied to the drain.

Now, the reason by which the substrate constant K of peripheral transistor increases if the implantation energy for channel doping increases will be described below. FIG. 38 shows impurity profiles in the case where the channel doping is effected with the implantation energy of 50 keV and the implantation energy of 60 keV. Referring to FIG. 38, a nearly equal threshold voltage is achieved with implantation energies of 50 keV and 60 keV. For achieving the nearly equal threshold voltage, it is necessary to provide a nearly equal impurity concentration at the surface of substrate, and for this purpose, implantation doses of impurity are adjusted depending on the implantation energies of 50 keV and 60 keV. More specifically, if the implantation energy is 60 keV, the impurity ion is implanted more deeply than the case of impurity implantation energy of 50 keV, so that the impurity concentration at the surface of substrate is small. Therefore, if the implantation energy is 60 keV, it is necessary to implant more impurity than that implanted with implantation energy of 50 keV. In this manner, the nearly equal implantation concentration is achieved at the surface of substrate with the implantation energies of 50 keV and 60 keV. At a region B in FIG. 38, the impurity concentration achieved with the implantation energy of 50 keV is higher than that achieved with 60 keV. Therefore, if the implantation energy is 60 keV, the depletion layer is suppressed more effectively from spreading between the source region and drain region, so that the punch-through phenomenon can be suppressed more effectively.

At a region A, the implantation energy of 60 kev achieve a higher impurity concentration than the implantation energy of 50 keV. Even when the substrate bias voltage is applied, the implantation energy of 60 kev achieves a higher impurity concentration at the region A in the substrate than the implantation energy of 50 keV. This means that the implantation energy of 60 keV suppresses the spreading of depletion layer toward the substrate as compared with the implantation energy of 50 keV. Therefore, if the implantation energy is 60 keV, a gate bias voltage must be larger than that in the case of implantation energy of 50 keV in order to obtain the channel current nearly equal to that obtained by the implantation energy of 50 keV. This means that, if the implantation energy is 60 keV, the substrate constant K is larger than that in the case of 50 keV.

As described above, if the conventional flash memory of the DINOR type is provided with N⁻-drain region 4 for reducing the interband tunnel current (leak current) in the memory cell transistor, such a problem arises that the punch-through phenomenon is likely to occur in the memory cell transistor. If the implantation dose of impurity for channel doping is increased in order to increase the resistance to punch-through phenomenon, such problems arise that the threshold voltage of transistor in the peripheral circuit increases and that the drain current decreases, and increase of the implantation energy for the channel doping results in a problem that the substrate constant K of the transistor in the peripheral circuit increases.

SUMMARY OF THE INVENTION

An object of the invention is to provide a nonvolatile semiconductor memory device, in which a leak current in a memory cell region can be reduced and further a punch-through phenomenon can be prevented.

Another object of the invention is to provide a nonvolatile semiconductor memory device, in which appropriate drive characteristics of a transistor in a peripheral circuit can be maintained and a punch-through phenomenon in a memory cell can be suppressed.

Still another object of the invention is to provide a method facilitating manufacturing of nonvolatile semiconductor memory device, in which a leak current is reduced and a punch-through phenomenon can be effectively prevented.

According to an aspect of the invention, a nonvolatile semiconductor memory device includes a semiconductor substrate, source and drain regions, a first impurity region and a second impurity region. The semiconductor substrate has a main surface and is of a first conductivity type. The source region and the drain region are formed on the main surface of the semiconductor substrate and are spaced from each other by a predetermined distance to define a channel region therebetween. The first impurity region is formed to cover at least the drain region, has an impurity concentration lower than that of the drain region and being of a second conductivity type. The second impurity region is formed under the first impurity region covering at least the drain region without covering a portion of the first impurity region near the channel region, and is of the first conductivity type.

According to the nonvolatile semiconductor memory device of the above aspect, the second impurity region prevents the punch-through phenomenon while the first impurity region prevents the leak current which may be caused by interband tunneling.

According to another aspect of the invention, a method of manufacturing a nonvolatile semiconductor memory device includes the steps of forming a source region and a drain region, forming a first impurity region, and forming a second impurity region. The source region and the drain region are formed on a main surface of a semiconductor substrate of a first conductivity type by ion-implanting impurity of a second conductivity type into the semiconductor substrate to define a channel region, and have the second conductivity type. The first impurity region has the second conductivity type, and is formed to cover at least the drain region and have an impurity concentration lower than that of the drain region. The second impurity region has the first conductivity type, and is formed under the first impurity region covering at least the drain region by ion-implanting impurity of the first conductivity type into the semiconductor substrate with an implantation angle not more than 8°.

According to the method of manufacturing the nonvolatile semiconductor memory device of the above aspect, the nonvolatile semiconductor memory device which can suppress both the leak current and the punch-through phenomenon can be manufactured easily.

A method of manufacturing a nonvolatile semiconductor memory device of still another aspect of the invention includes the steps of performing first channel doping and performing second channel doping. The first channel doping is performed by ion-implanting impurity of a first conductivity type into a predetermined region on a main surface of a semiconductor substrate of the first conductivity type with a first implantation energy. The second channel doping is performed by ion-implanting impurity of the first conductivity type into a predetermined region on the main surface of the semiconductor substrate with a second implantation energy larger than the first implantation energy.

According to the method of manufacturing the nonvolatile semiconductor memory device of the above aspect, the channel doping is performed two times, and specifically, the first channel doping with the first implantation energy and the second channel doping with the second implantation energy larger than the first implantation energy are performed, so that a channel doped layer have relatively flat impurity distribution along a depth direction of the substrate. Thus, formation of a region of a low impurity concentration is suppressed as compared with the prior art. Thereby, the punch-through phenomenon is suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to the drawings.

Figure 1:
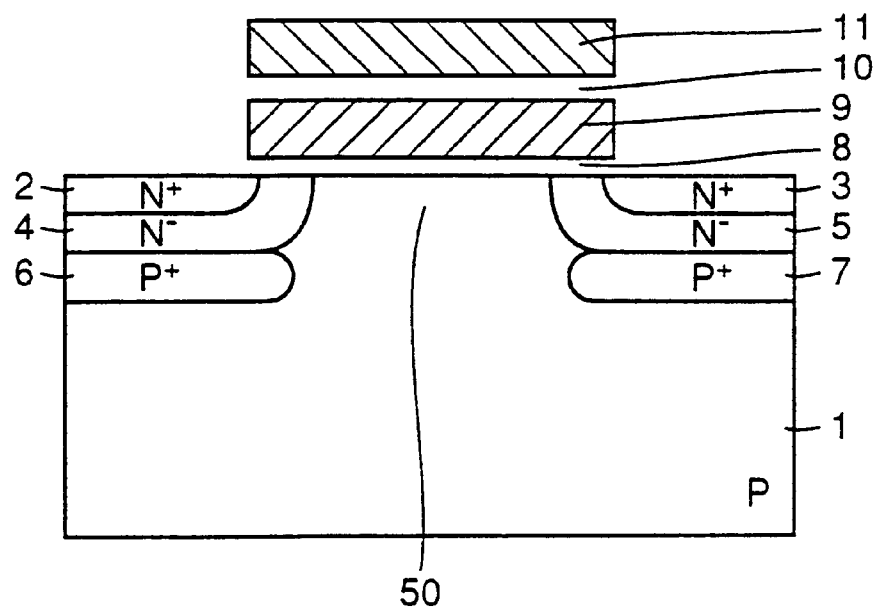
FIG. 1 is a cross section of a flash EEPROM of a DINOR type of a first embodiment of the invention.

Referring to FIG. 1, a flash EEPROM of a DINOR type of a first embodiment is provided at a main surface of a P-type semiconductor substrate 1 with an N$^+$-drain region 2 and an N$^+$-source region 3 which are located at opposite sides of a channel region 50 and are spaced from each other by a predetermined distance. N$^+$-drain region 2 is covered with an N$^-$-drain region 4. N$^+$-source region 3 is covered with an N$^-$-source region 5. A P$^+$-impurity region 6 is formed under N$^-$-drain region 4. A P$^+$-impurity region 7 is formed under N$^-$-source region 5.

Figure 2:
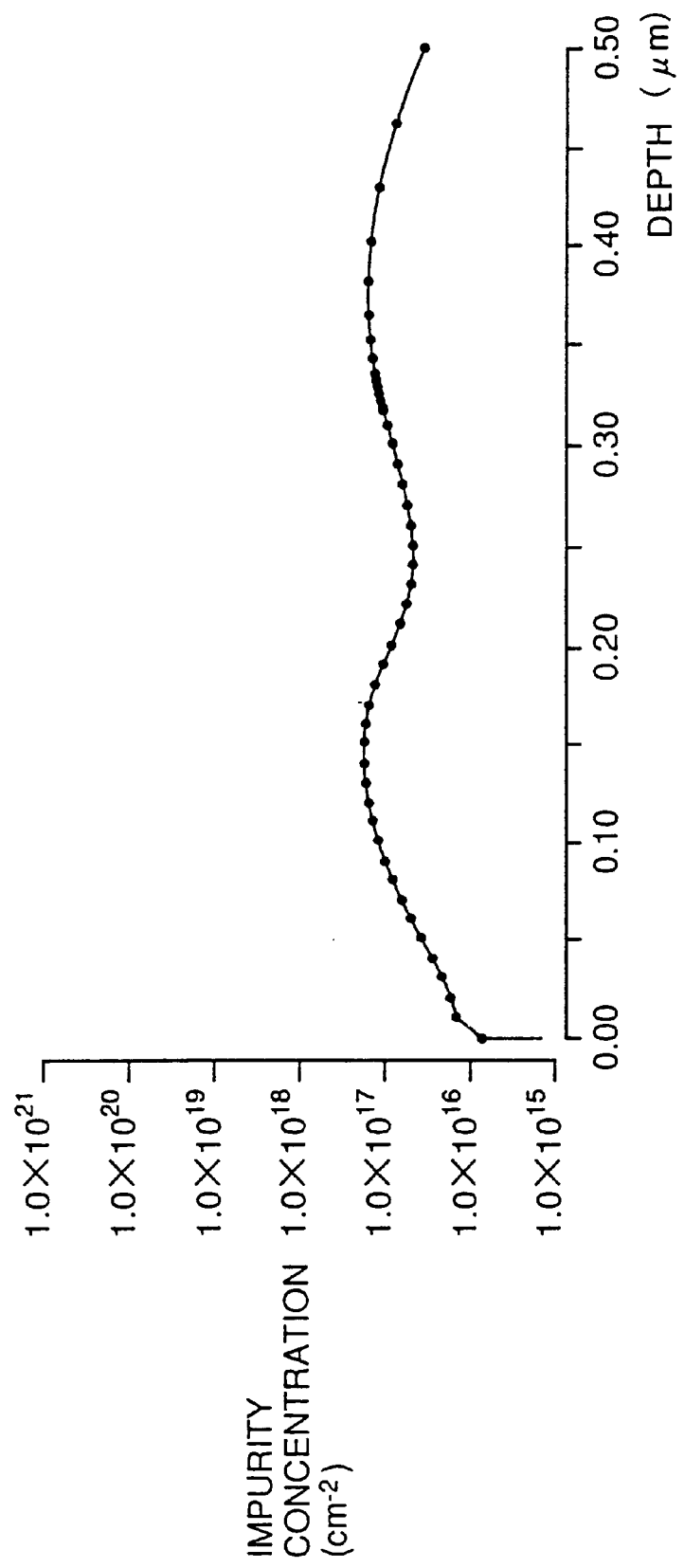
FIG. 2 shows an impurity profile at a channel region of the flash EEPROM of the first embodiment shown in FIG. 1.
Figure 3:
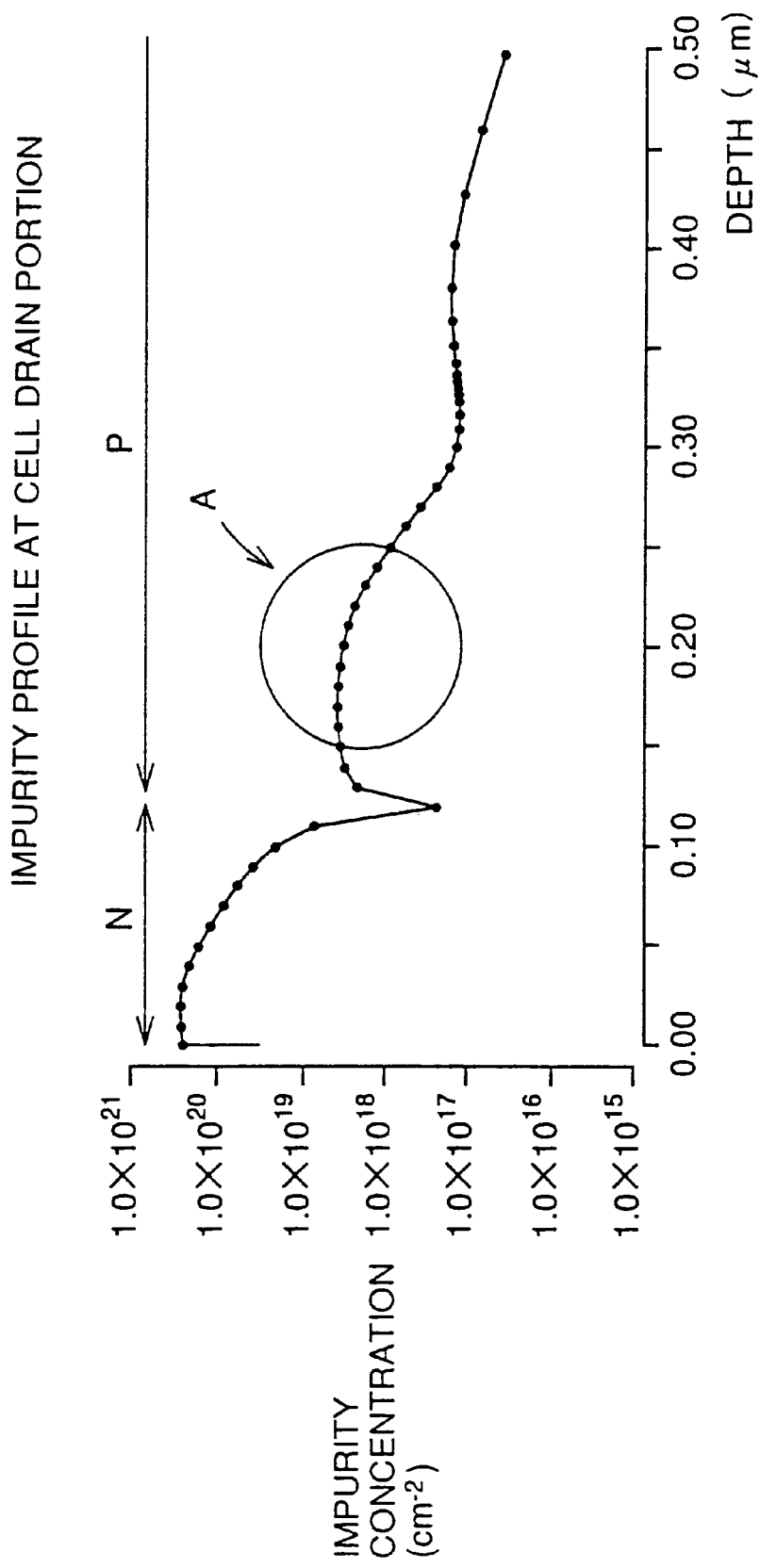
FIG. 3 shows an impurity profile at a drain region of the flash EEPROM of the first embodiment shown in FIG. 1.
Figure 4:
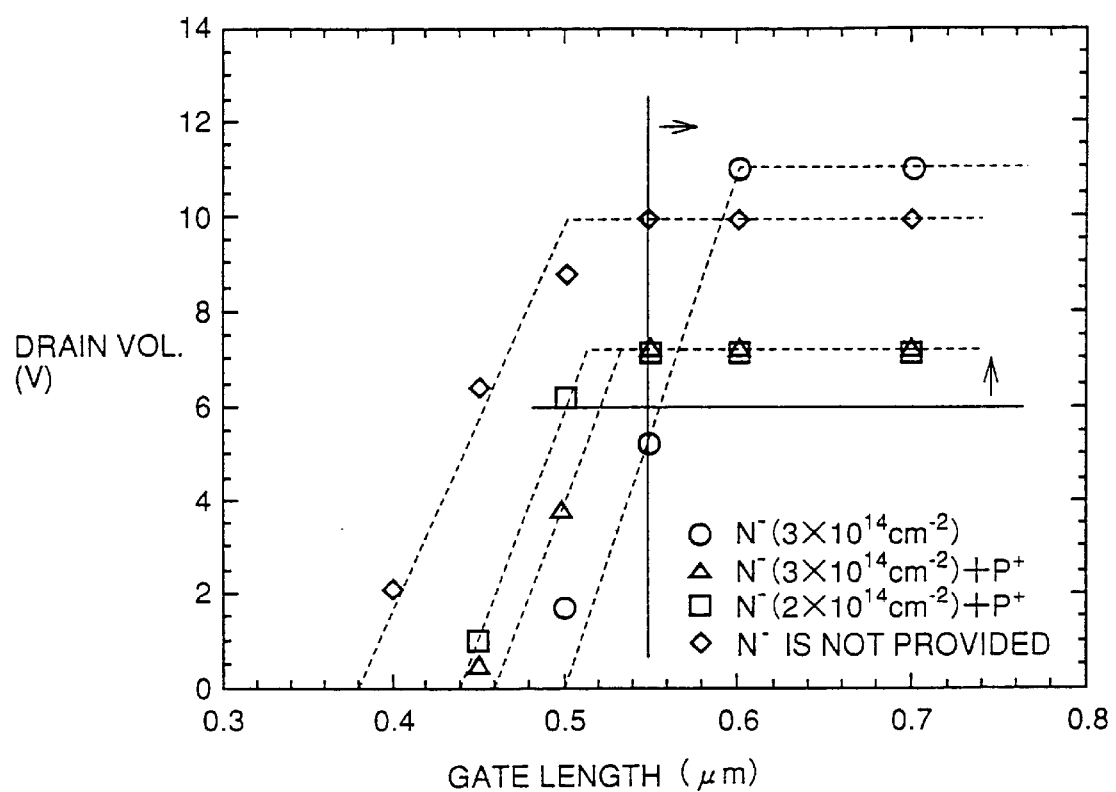
FIG. 4 is a graph showing minimum gate lengths and drain breakdown voltages in the cases where a P$^+$-impurity region/is provided and not provided.
Figure 34:
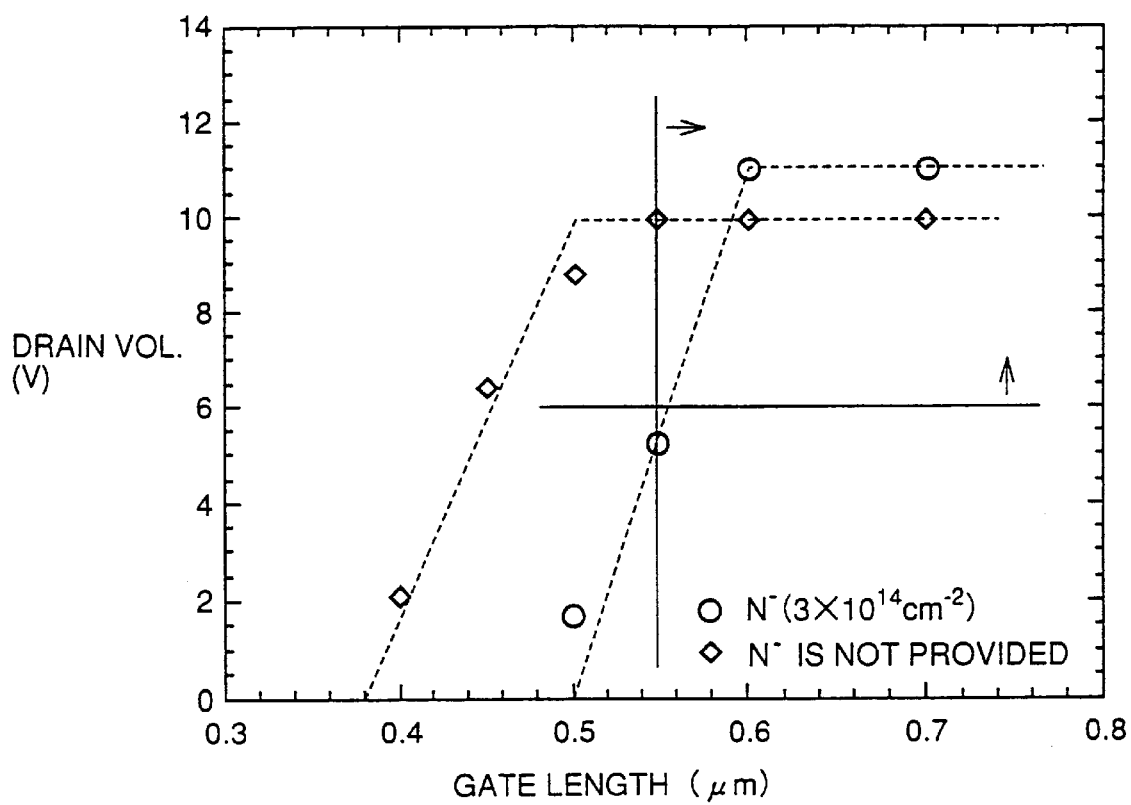
FIG. 34 is a graph showing a relationship between a gate length and a drain voltage in the cases where the N$^-$-region is provided and not provided.
Figure 35:
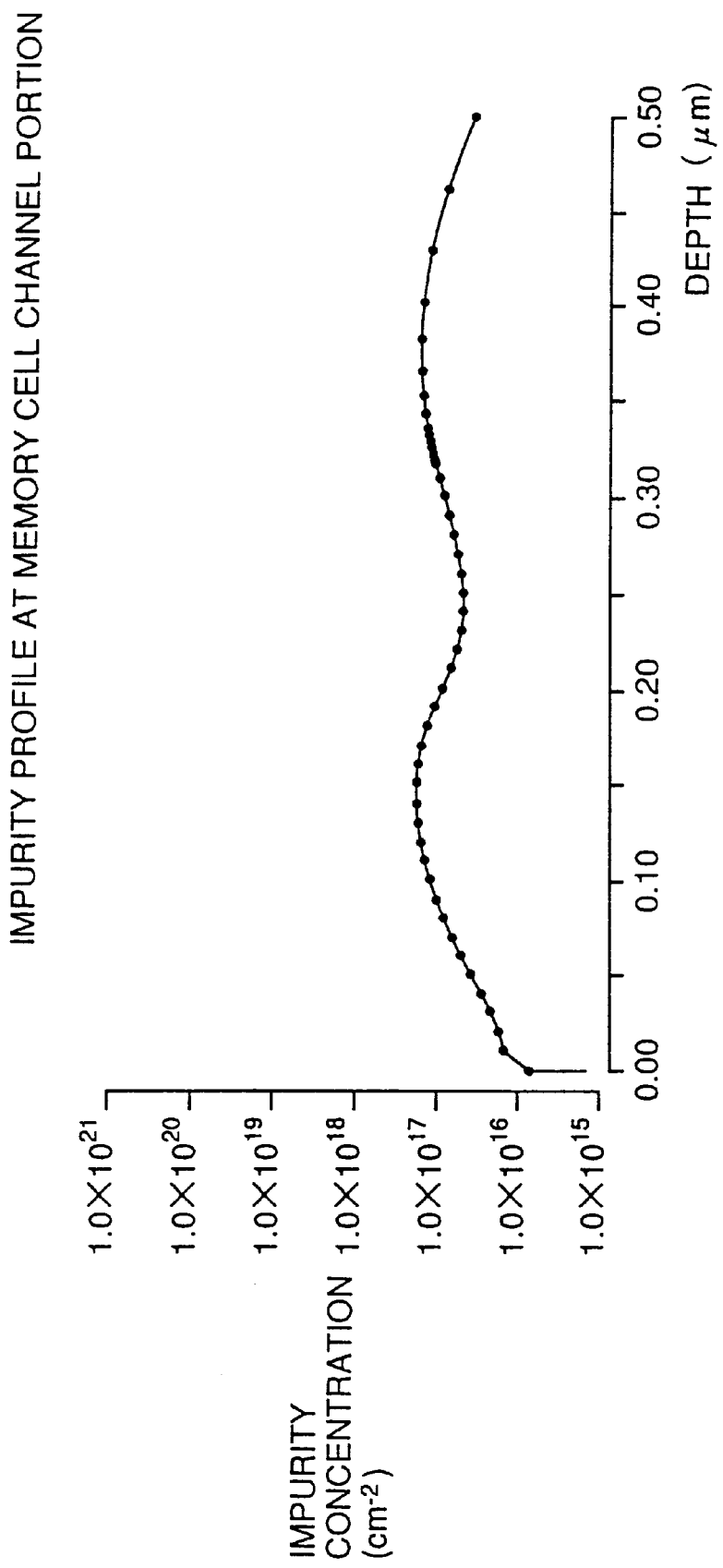
FIG. 35 shows an impurity profile at the channel portion of the conventional flash EEPROM shown in FIG. 20.
Figure 36:
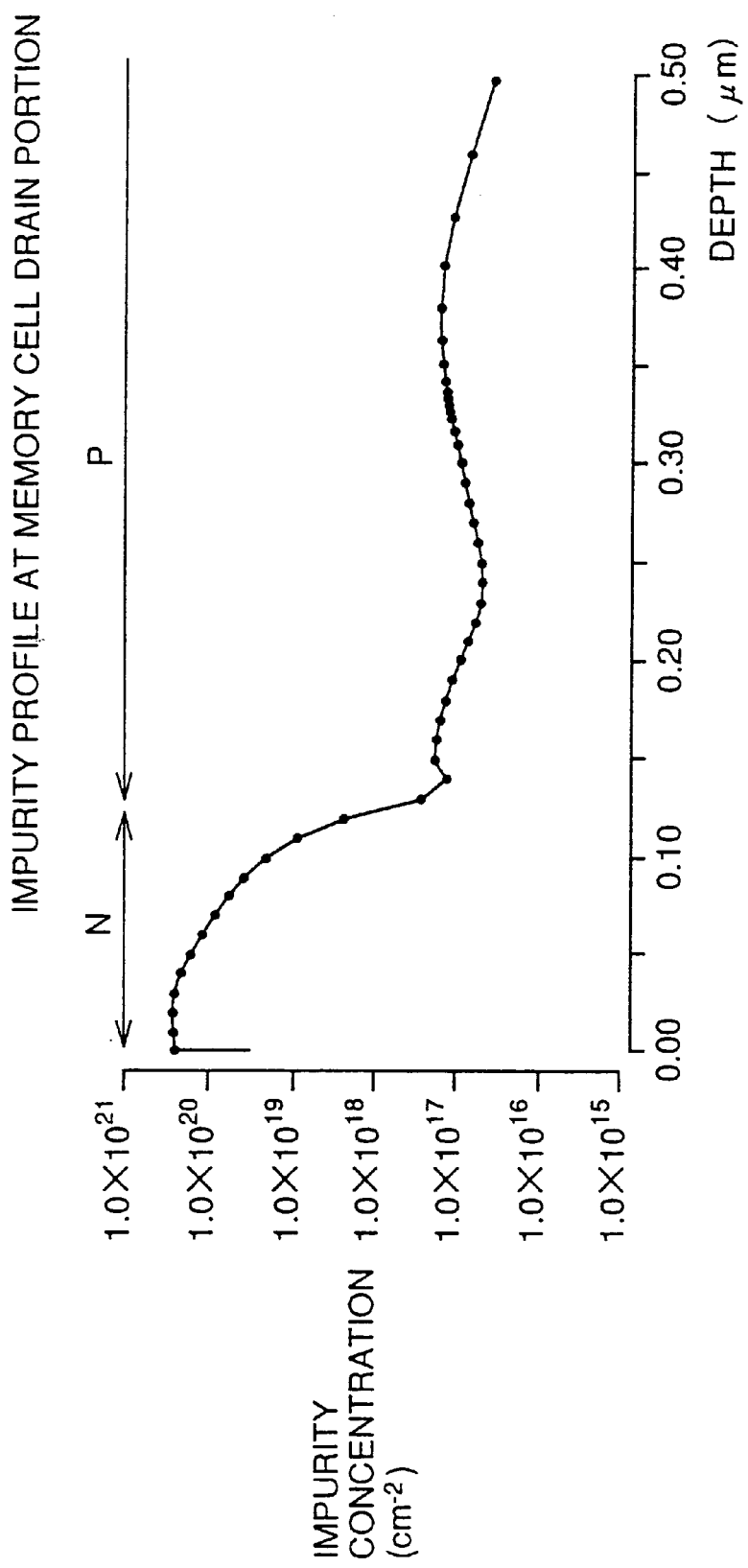
FIG. 36 shows an impurity profile at the drain portion of the conventional flash EEPROM shown in FIG. 20.

Referring to FIG. 2, the impurity profile at the channel portion is the same as that in the prior art. As shown in FIG. 3, however, the impurity profile at the drain portion differs from the conventional impurity profile shown in FIG. 36 in that the impurity concentration is high at a portion indicated by A. This is caused by the provision of P$^+$-impurity region 6. Description will be given on the fact that the punch-through phenomenon is prevented by the provision of P$^+$-impurity regions 6 and 7. FIG. 4 is a graph showing data resulting from the provision of P$^+$-impurity region 6 in addition to the conventional data already described and shown in FIG. 34. It can be see from FIG. 4 that the minimum value of gate length of the structure provided with P$^+$-impurity region 6 (indicated by triangular and square marks in the figure) is smaller by about 0.05 μm than that of the structure provided only with N$^-$-drain region (indicated by circular marks). This means that provision of P$^+$-impurity region 6 can suppress the punch-through phenomenon.

However, as a result of provision of P$^+$-impurity regions 6 and 7, P$^+$-impurity region 6 adjoins to N$^-$-drain region 4, and P$^+$-impurity region 7 adjoins to N$^-$-source region 5, so that a high electric field is likely to generate, resulting in reduction of breakdown voltage. This is apparent from the fact that the structure provided with P$^+$-impurity region 6 has a breakdown voltage of 7 V as represented by horizontal portions containing triangular and square marks, while the structure provided with only the N$^-$-drain region can have a breakdown voltage of 11 V as represented by a horizontal portion containing circular marks. Therefore, an upper limit of the impurity concentration at P$^+$-impurity regions 6 and 7 must be determined taking a junction breakdown voltage and others into consideration.

Figure 5:
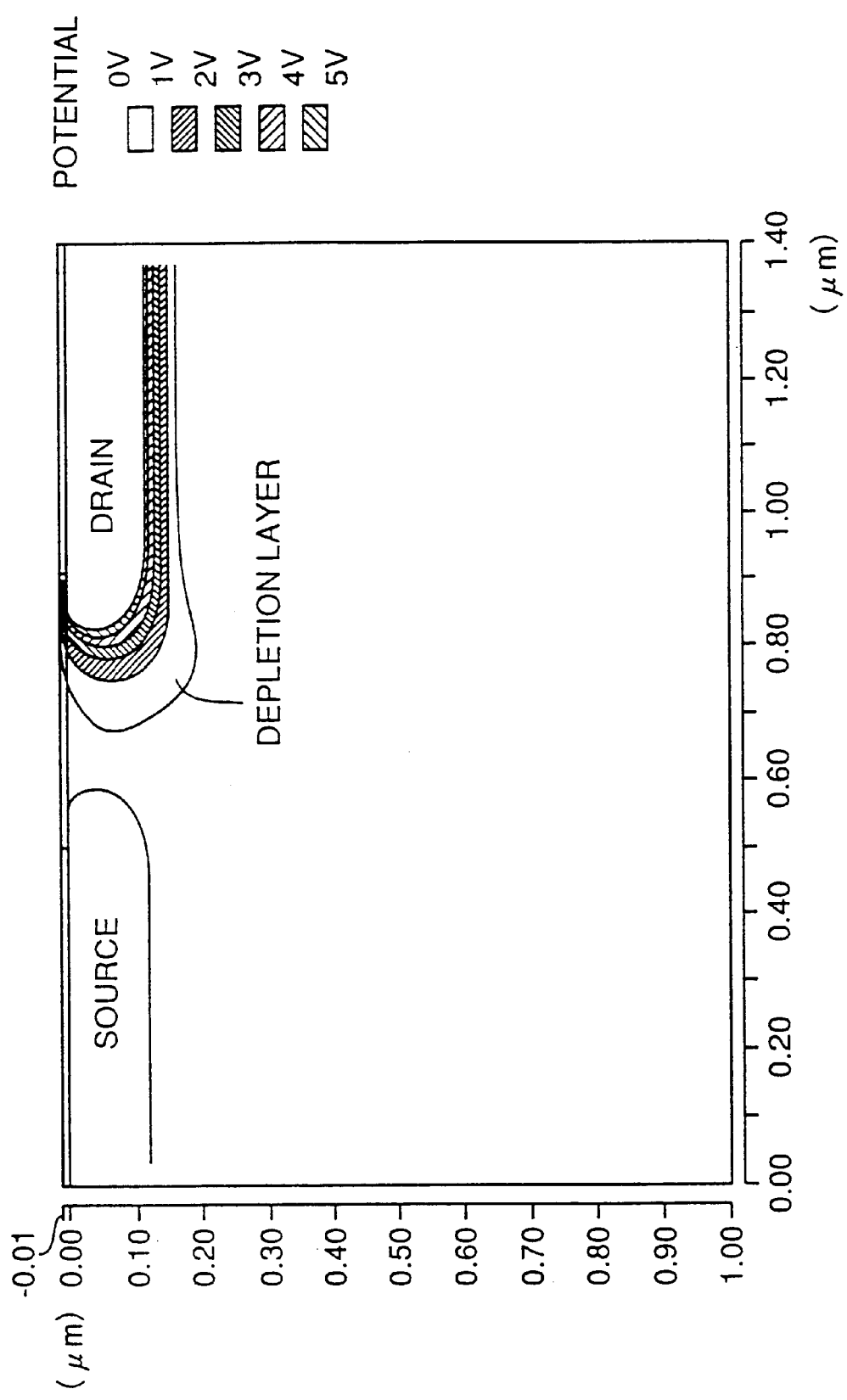
FIG. 5 shows extension of a depletion layer in the case where 5 V is applied to a drain region in the first embodiment shown in FIG. 1.
Figure 37:
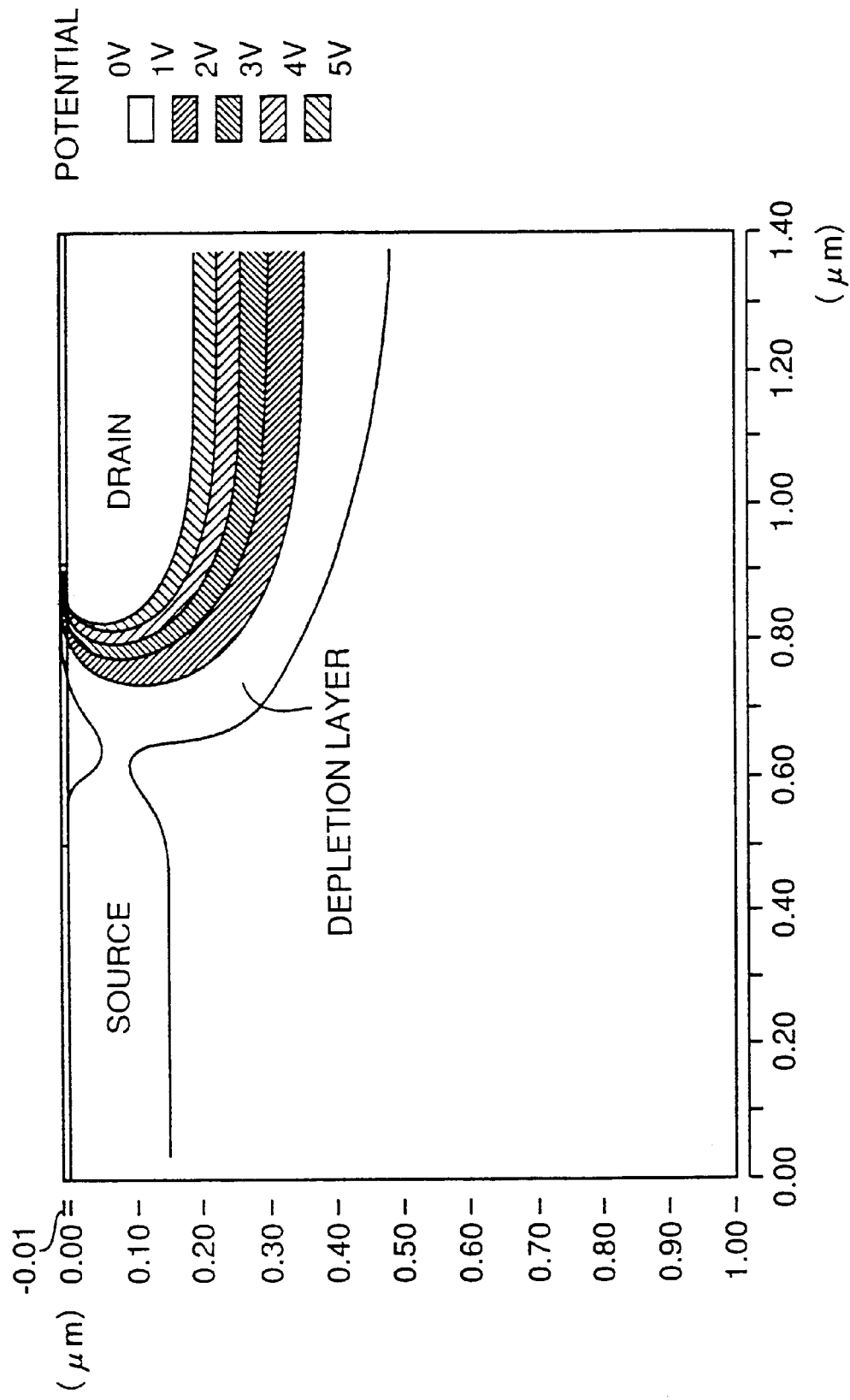
FIG. 37 is a schematic diagram showing extension of a depletion layer in the conventional flash EEPROM shown in FIG. 20 in which 5 V is applied to the drain region.
Figure 38:
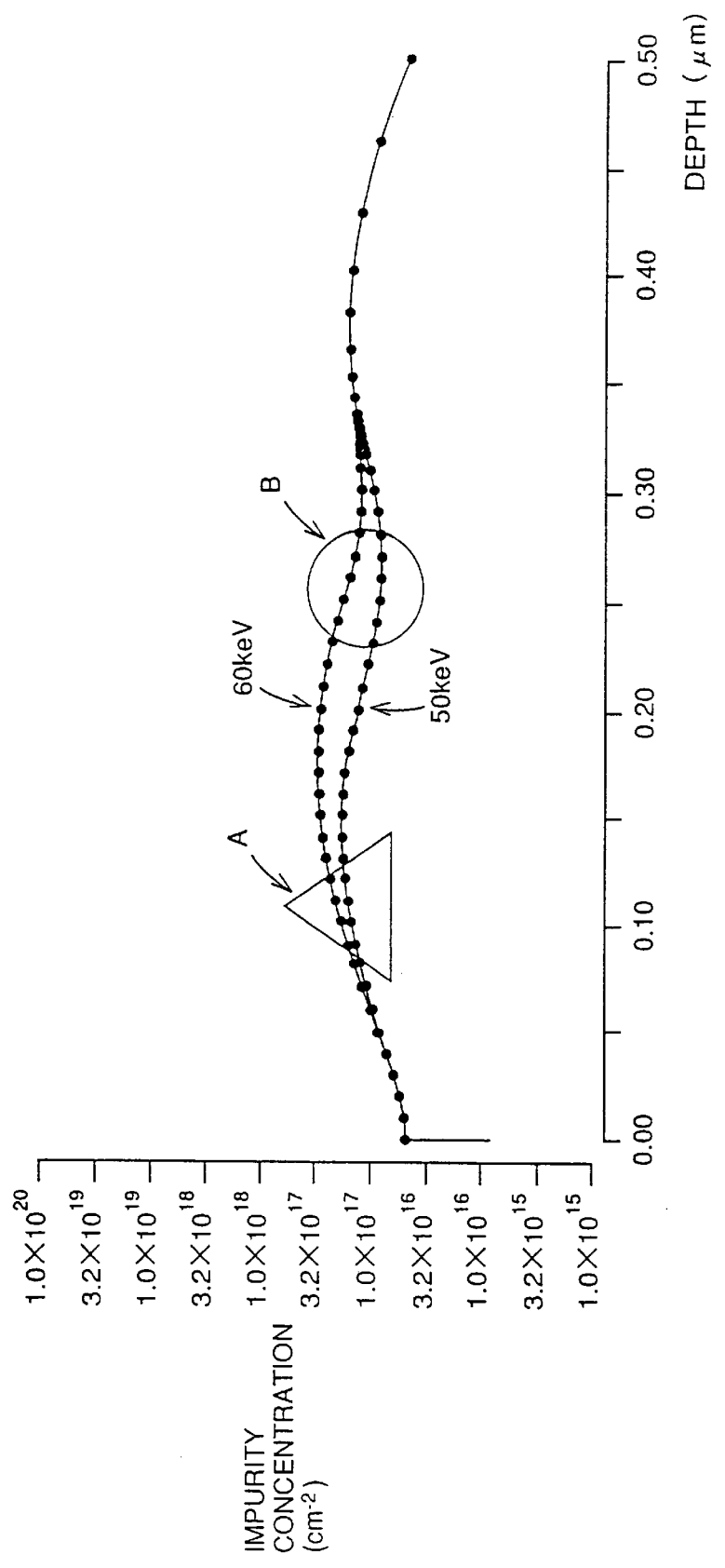
FIG. 38 is a graph schematically showing the fact that a substrate constant increases if an implantation energy for channel doping is increased in the prior art.

FIG. 5 corresponds to FIG. 37 showing extension of the depletion layer in the prior art. Referring to FIGS. 5 and 37, it can be understood that provision of P$^+$-impurity regions 6 and 7 suppresses extension of the depletion layer. Thus, it can be understood that the structure of the first embodiment effectively suppresses the punch-through phenomenon as compared with the conventional structure.

According to the structure of the first embodiment, although N$^-$-drain region 4 is provided for suppressing the interband tunnel current (leak current), the punch-through phenomenon can be suppressed by P$^+$-impurity regions 6 and 7 as described above. Thereby, the gate length can be shorter than that in the prior art, and integration to a higher extent is allowed.

In the structure of the first embodiment shown in FIG. 1, P$^+$-impurity region 6 is formed only under N$^-$-drain region 4 without covering a portion of N$^-$-drain region 4 near the channel region by the following reason. If P$^+$-impurity region 6 covered the portion of N$^-$-drain region 4 near channel region 50, the impurity in P$^+$-impurity region 6 would compensate the impurity in N$^-$-drain region 4. As a result, the position of P-N junction interface would recede toward N$^{30}$-drain region 2. This would result in disadvantageous increase of the effective channel length and thus increase of the threshold voltage. In this embodiment, P$^+$-impurity region 6 is formed only under the N$^-$-drain region 4 for preventing the above disadvantage.

Figure 6:
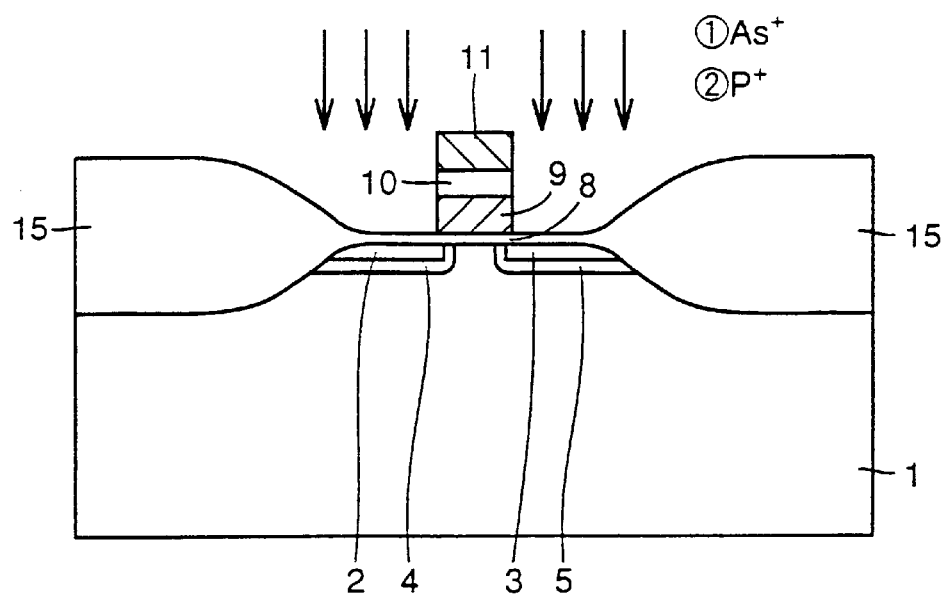
FIGS. 6 and 7 are cross sections showing 1st and 2nd steps in a process of manufacturing the flash EEPROM of the first embodiment shown in FIG. 1, respectively.
Figure 7:
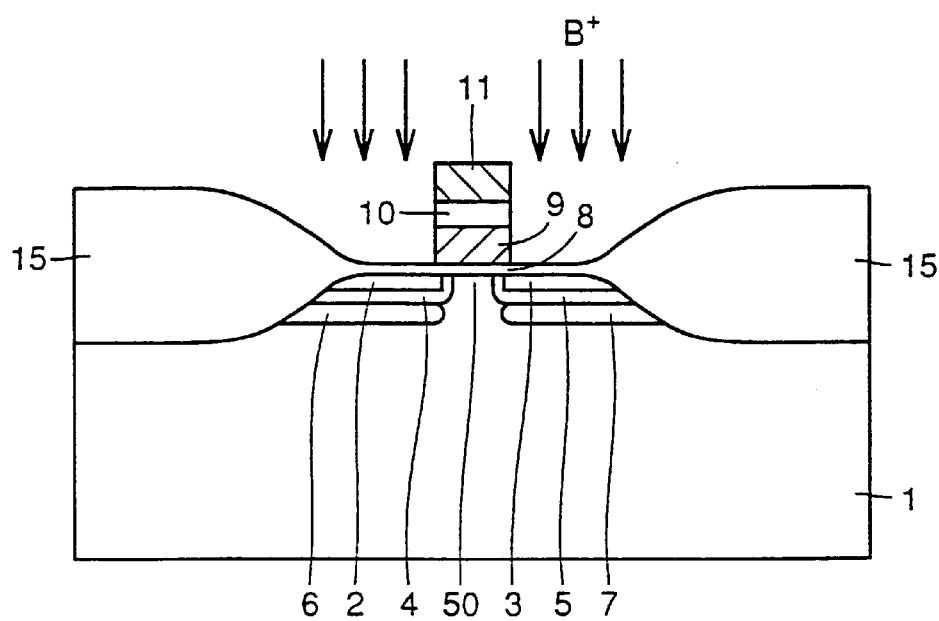

Referring to FIGS. 6 and 7, a process of manufacturing the flash EEPROM of the DINOR type of the first embodiment will be described below.

Referring to FIG. 6, an element isolating oxide film 15 having a thickness from about 4000 to about 6000 Å is formed on the main surface of P-type semiconductor substrate 1. After forming a channel stopper layer (not shown), a channel doped layer (not shown) is formed. Then, insulating film 8 made of a tunnel oxide film is formed to have a thickness from about 80 to about 110 Å. After forming a polycrystalline silicon film (not shown) having a thickness from about 500 to about 2000 Å on insulating film 8 and element isolating oxide film 15, an ONO film (SiO$_2$+SiN+SiO$_2$) (not shown) having a thickness from about 50 to about 300 Å on the polycrystalline silicon film. A polycrystalline silicon film (not shown) having a thickness from about 500 to about 2000 Å is formed on the ONO film. Thereafter, the polycrystalline silicon film at the upper level, the ONO film and the polycrystalline silicon film at the lower level are patterned to form control gate electrode 11, interlayer insulating film 10 and floating gate electrode 9.

Using control gate electrode 11 as a mask, arsenic (As) is ion-implanted into P-type semiconductor substrate 1 under the conditions of 30–60 keV and $1 \times 10^{15} - 8 \times 10^{15}$ cm$^{-2}$. Thereby, N$^+$-drain region 2 and N$^+$-source region 3 are formed. Thereafter, using control gate electrode 11 and element isolating oxide film 15 as a mask, phosphorus (P) is ion-implanted into P-type semiconductor substrate 1 under the conditions of 30–60 keV and $1 \times 10^{13} - 1 \times 10^{15}$ cm$^{-2}$. Thereby, N$^-$-drain region 4 and N$^-$-source region 5 are formed.

Then, as shown in FIG. 7, boron (B) is ion-implanted into P-type semiconductor substrate 1 using control gate electrode 11 and element isolating oxide film 15 as a mask. Thereby, P$^+$-impurity regions 6 and 7 are formed immediately under N$^-$-drain region 4 and N$^-$-source region 5. This ion implantation is performed with an implantation concentration of about $1 \times 10^{13} - 1 \times 10^{14}$ cm$^{-2}$ and an implantation angle not more than 8° with respect to the direction perpendicular to the main surface of P-type semiconductor substrate 1. Thereby, P$^+$-impurity regions 6 and 7 are formed only immediately under N$^-$-drain region 4 and N$^-$-source region 5, respectively. The impurity concentration at P$^+$-impurity regions 6 and 7 is set to be smaller than that at N$^-$-drain region 4 and N$^-$-source region 5 by the following reason. If the impurity concentration at P$^+$-impurity regions 6 and 7 were larger than that at N$^-$-drain region 4 and N$^-$-source region 5, the P-type impurity would diffuse into a portion of the surface of channel region 50 near the drain due to the thermal processing after the implantation, so that the concentration of P-type impurity at the portion of channel region near the drain would be higher than that at the central portion of channel region. In this embodiment, the impurity concentration at P$^+$-impurity regions 6 and 7 is smaller than that at N$^-$-drain region 4 and N$^-$-source region 5, so that the concentration of P-type impurity at the central portion of channel region is nearly equal to that at the portion of channel region near the drain.

In the process of manufacturing the flash EEPROM of the first embodiment shown in FIGS. 6 and 7, N$^+$-drain region 2 and N$^+$-source region 3 can be formed at the same implanting step because of a symmetrical structure, so that the manufacturing process can be simpler than the prior art.

Figure 8:
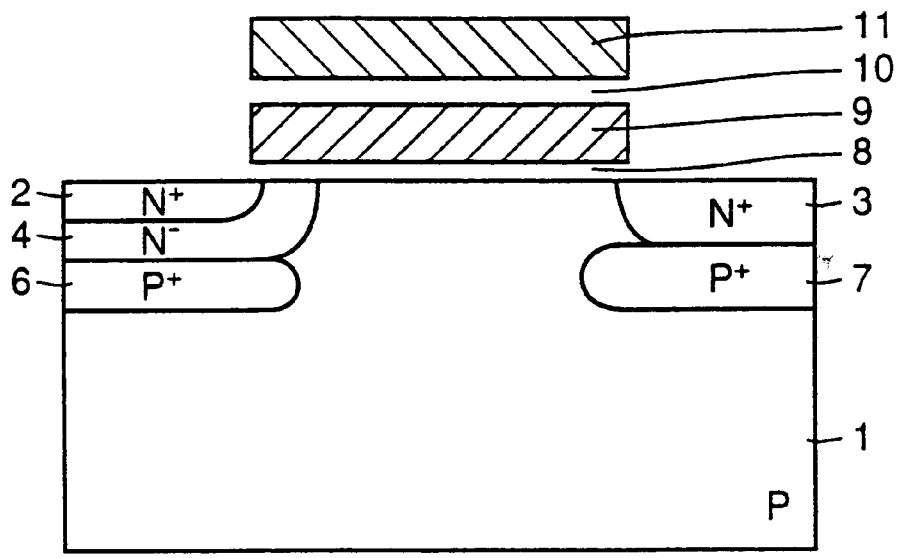
FIG. 8 is a cross section of a flash EEPROM of a DINOR type of a second embodiment of the invention.

Referring to FIG. 8, a second embodiment differs from the first embodiment in that P$^+$-impurity region 7 is formed directly under N$^+$-source region 3. This structure can also achieve the same effect as the first embodiment already described. In the structure of the second embodiment, since the $N^-$-source region is not disposed at the side of $N^+$-source region 3, the gate length can be shorter than that in the first embodiment. Thus, the structure of the second embodiment is more suitable to higher integration.

Figure 9:
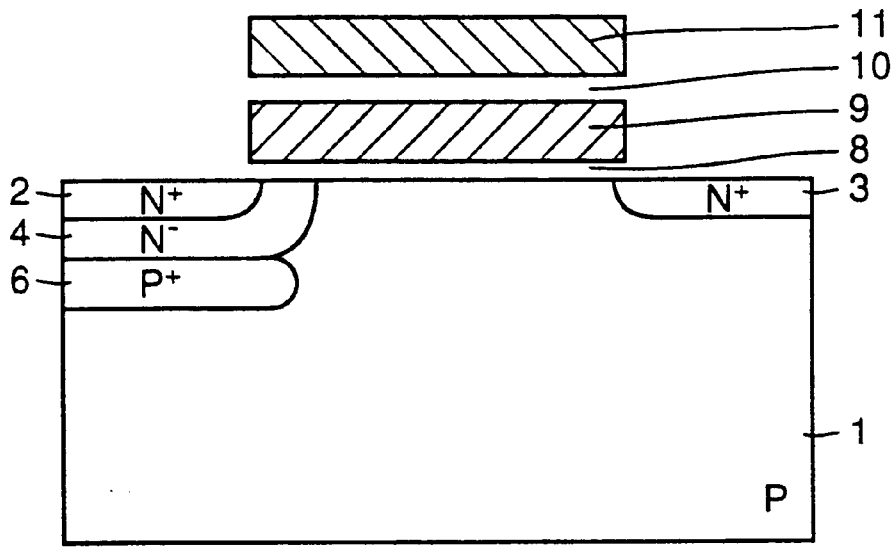
FIG. 9 is a cross section of a flash EEPROM of a DINOR type of a third embodiment of the invention.

In a third embodiment shown in FIG. 9, $N^-$-drain region 4 and $P^+$-impurity region 6 are formed only at the side of $N^+$-drain region 2. This structure can also achieve an effect similar to those of the first and second embodiments already described. Thus, the punch-through phenomenon can be suppressed by $P^+$-impurity region 6, while preventing the leak current by $N^-$-drain region 4. In the third embodiment, since there is not provided an $N^-$-source region covering $N^+$-source region 3, the allowable minimum value of gate length can be smaller than that in the first embodiment.

Referring to FIGS. 10–15, description will be given on a process of manufacturing a flash EEPROM of the DINOR type of a fourth embodiment.

Figure 10:
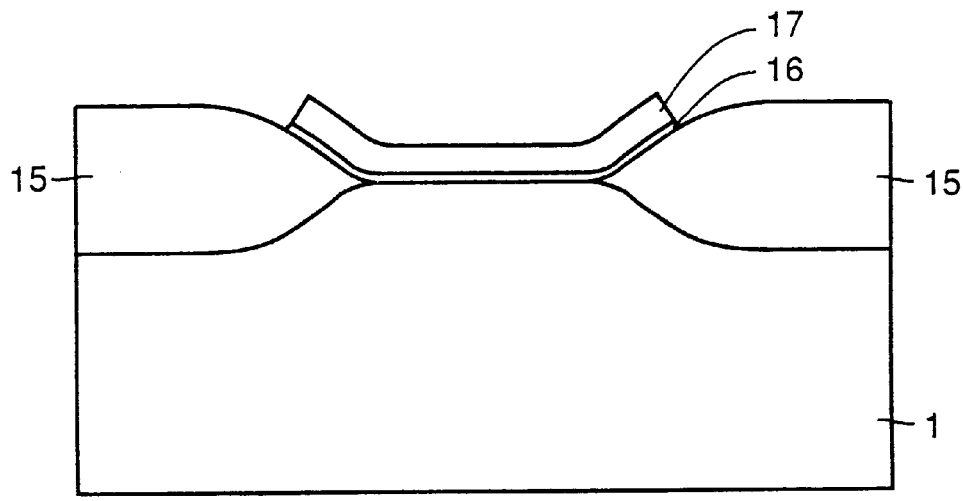
FIGS. 10 to 15 are cross sections showing 1st to 6th steps in a process of manufacturing the flash EEPROM of the DINOR type of the fourth embodiment, respectively.

Referring first to FIG. 10, steps similar to those in the prior art are performed to form an $SiO_2$ film 16 having a thickness from about 100 to about 500 Å and a nitride film 17 having a thickness from about 500 to about 2000 Å at a predetermined region on the main surface of P-type semiconductor substrate 1. Thermal processing is performed using $SiO_2$ film 16 and nitride film 17 as a mask, so that element isolating oxide film 15 having a thickness from about 4000 to about 6000 Å is formed. Thereafter, $SiO_2$ film 16 and nitride film 17 are removed.

Figure 11:
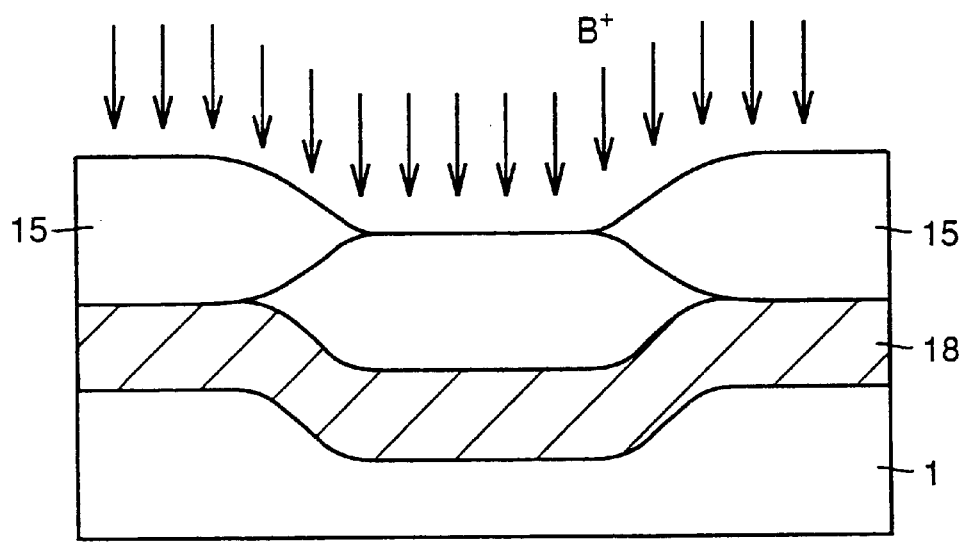

Referring to FIG. 11, boron (B) is ion-implanted into P-type semiconductor substrate 1 with the conditions of 120–200 keV and $2\times10^{12}$–$6\times10^{12}$ cm$^{-2}$. Thereby, a channel stopper layer 18 is formed.

Figure 12:
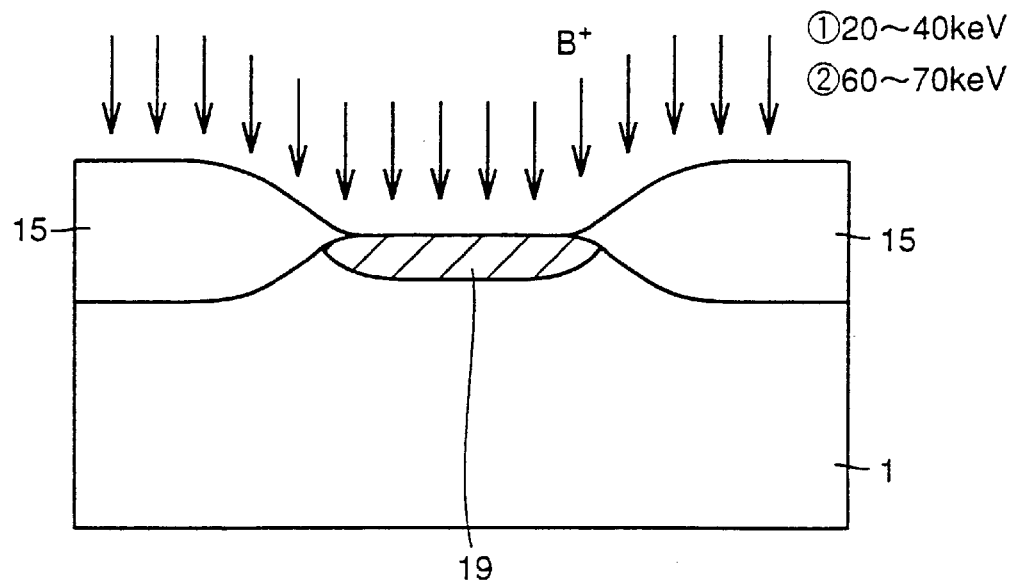
Figure 16:
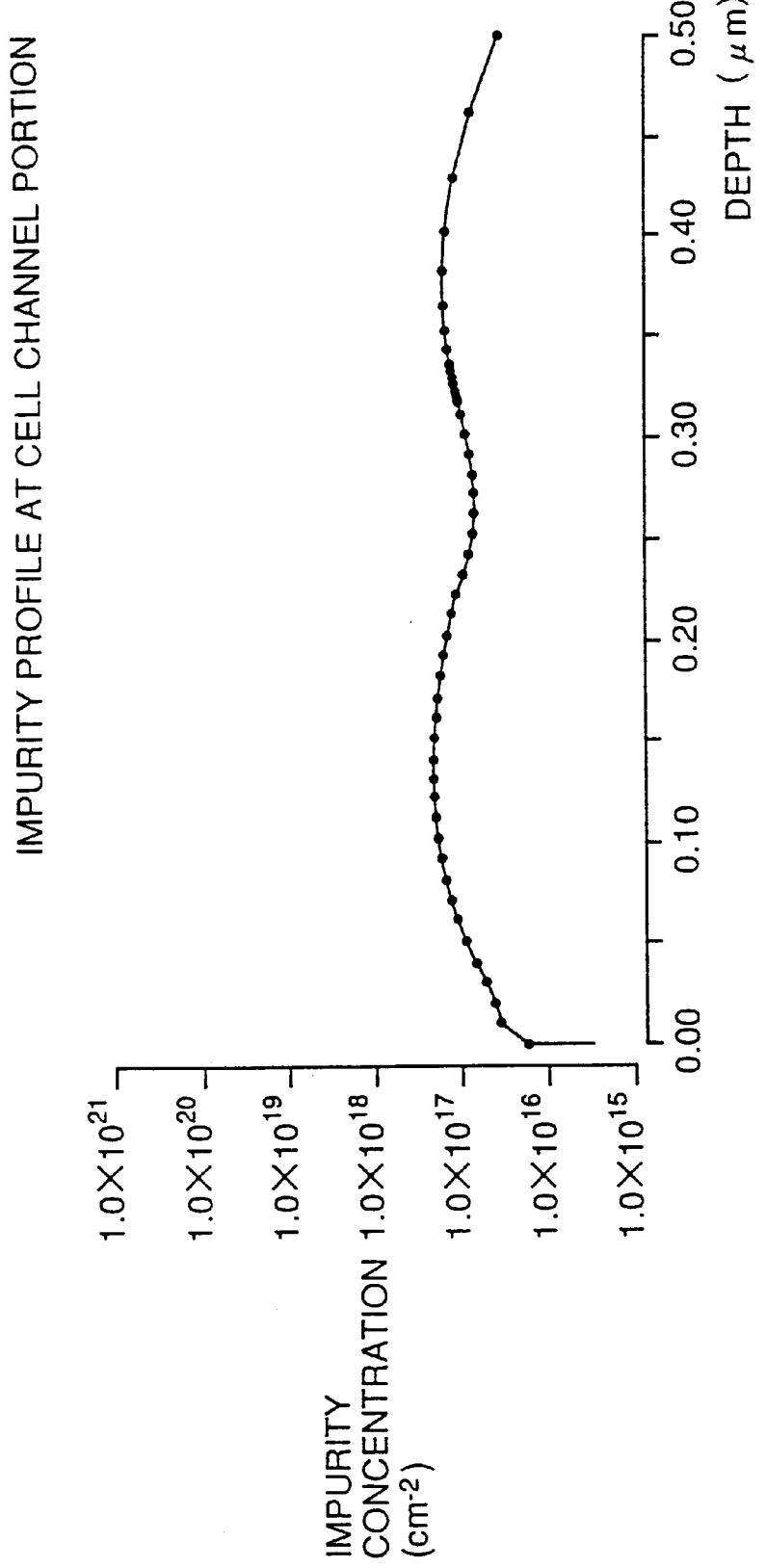
FIG. 16 shows an impurity profile at a channel portion of the flash EEPROM of the fourth embodiment shown in FIG. 15.
Figure 17:
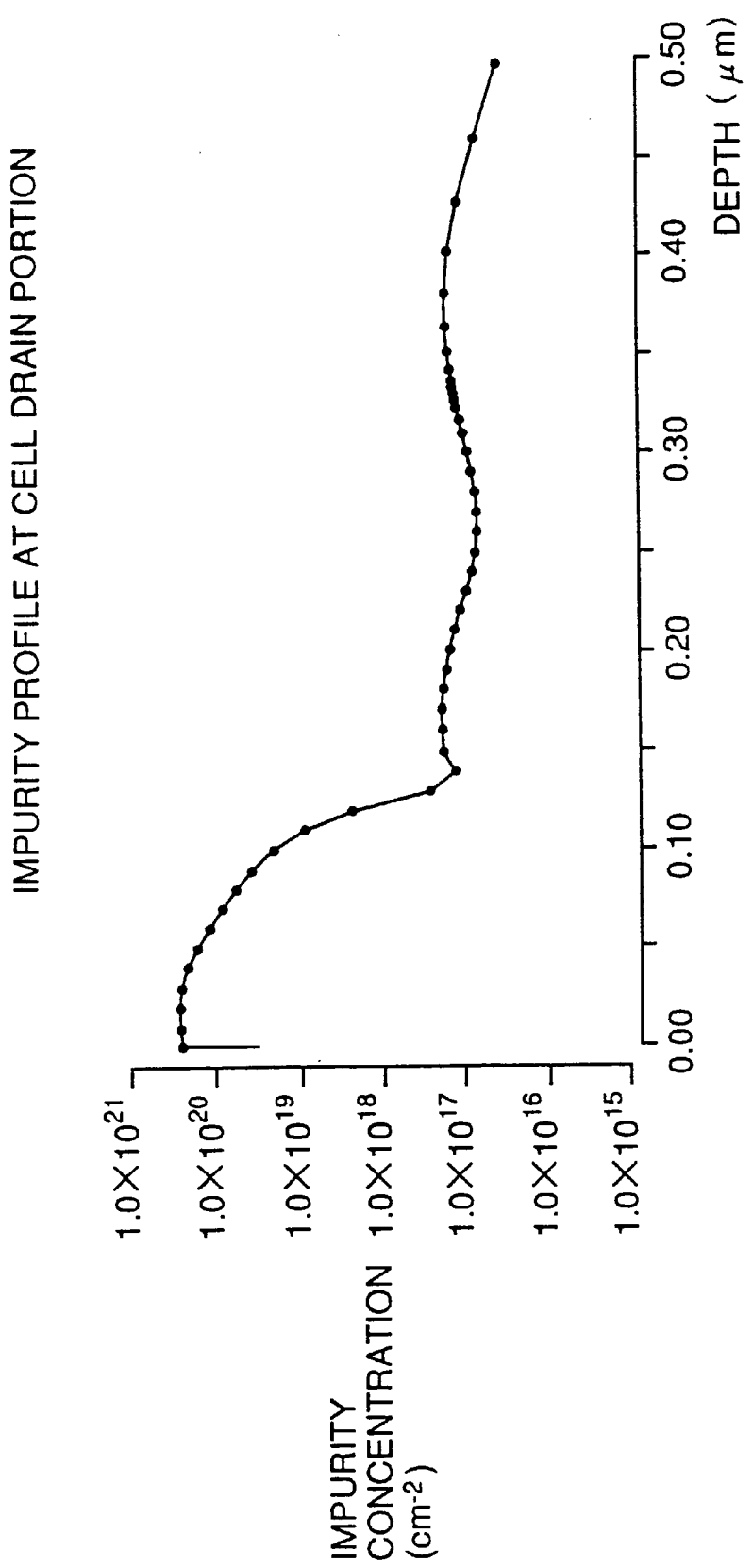
FIG. 17 shows an impurity profile at a drain portion of the flash EEPROM of the fourth embodiment shown in FIG. 15.

Referring to FIG. 12, boron is implanted into P-type semiconductor substrate 1 with the implantation energy of 20–40 keV, and then boron is implanted into P-type semiconductor substrate 1 with the implantation energy of 60–70 kev again. The first implantation may be performed with $BF_2$. In this embodiment, since the channel doping is performed two times with different implantation energies, the impurity profile at the channel doped layer 18 along the depth direction of P-type semiconductor substrate 1 is flatter than the prior art. The impurity profile at the channel region of memory cell is shown in FIG. 16. Referring to FIG. 16,.by performing the channel doping two times as described above, the impurity concentration at the region of 0.2–0.3 μm increases as compared with the prior art. Thereby, the punch-through phenomenon can be suppressed effectively. The drain portion of memory cell which is ultimately formed has an impurity profile shown in FIG. 17.

Figure 13:
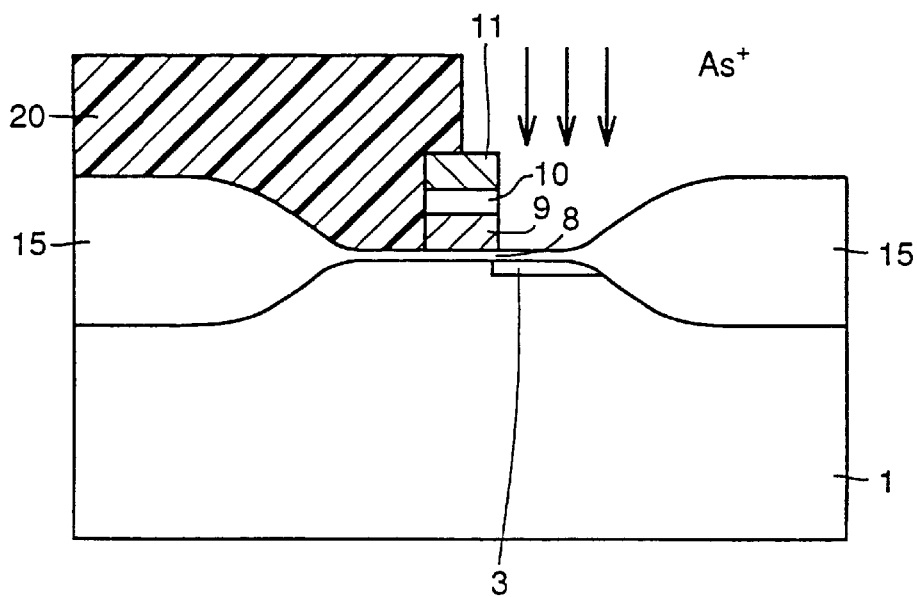

As shown in FIG. 13, steps similar to those in the prior art are then performed to form insulating film 8, floating gate electrode 9, interlayer insulating film 10 and control gate electrode 11. A resist 20 is formed to cover a drain formation region. Using resist 20 as a mask, arsenic (As) is ion-implanted into a source formation region with the conditions of 30–60 keV and $1\times10^{15}$–$8\times10^{15}$ cm$^{-2}$. Thereby, $N^+$-source region 3 is formed. Thereafter, resist 20 is removed.

Figure 14:
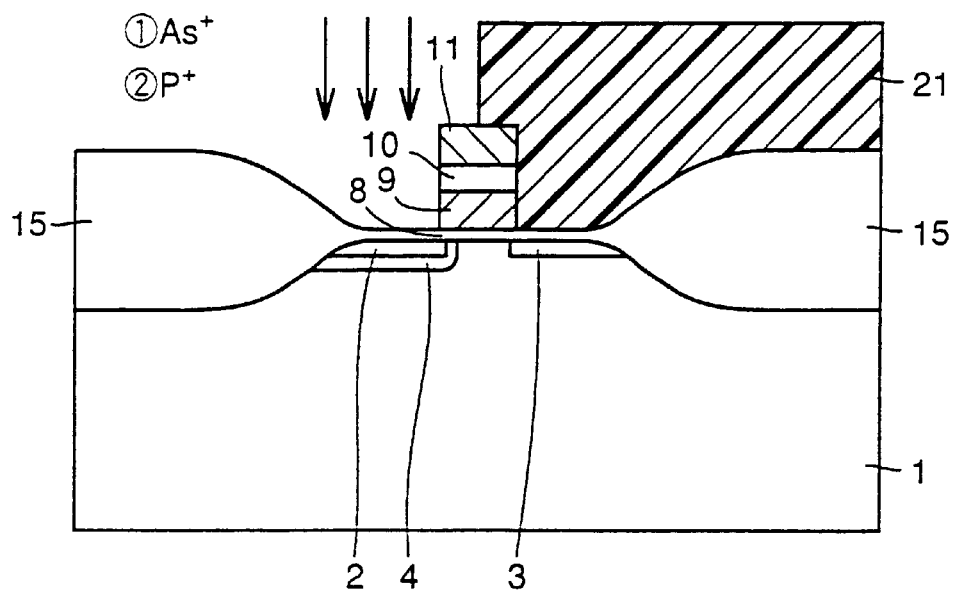
Figure 15:
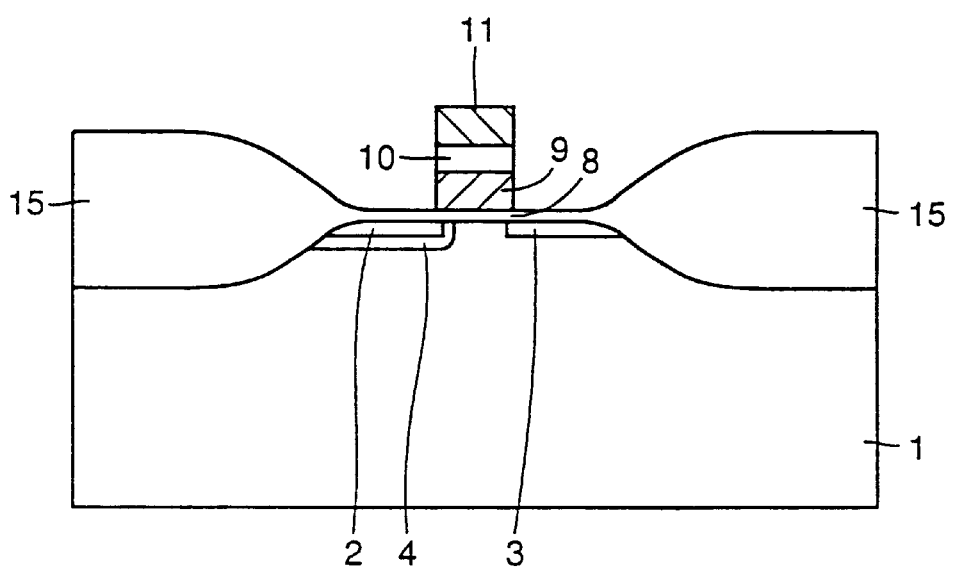
Figure 18:
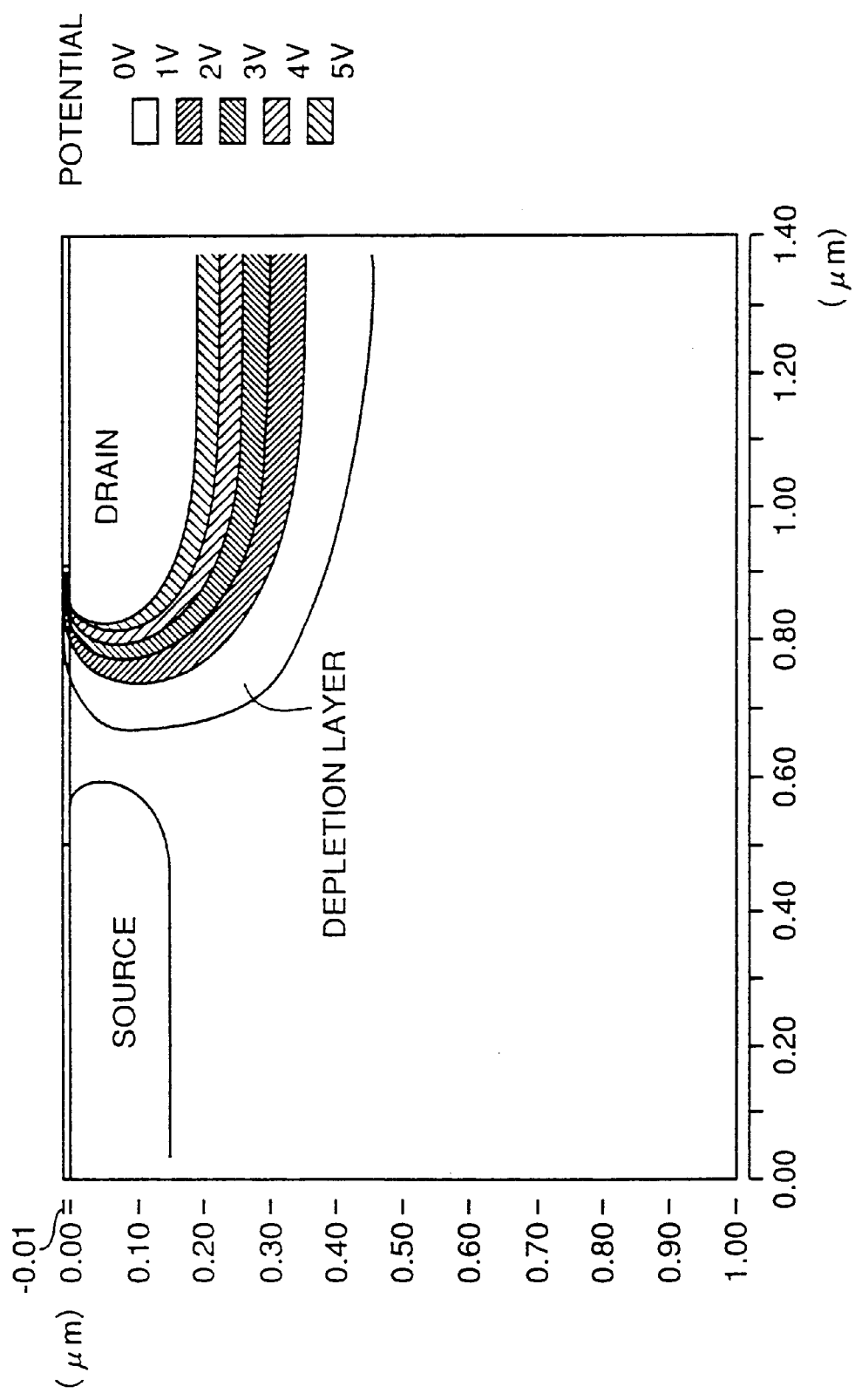
FIG. 18 schematically shows extension of a depletion layer in the flash EEPROM of the fourth embodiment.
Figure 19:
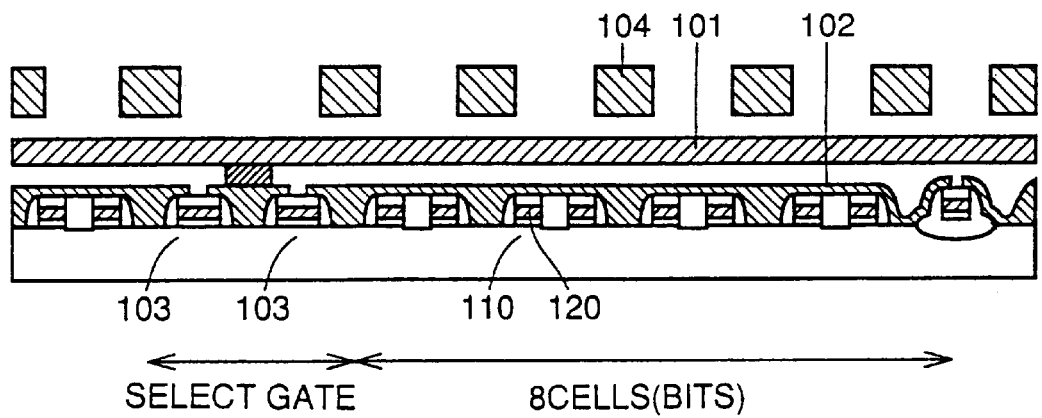
FIG. 19 is a cross section showing a conventional flash EEPROM of the DINOR type.
Figure 20:
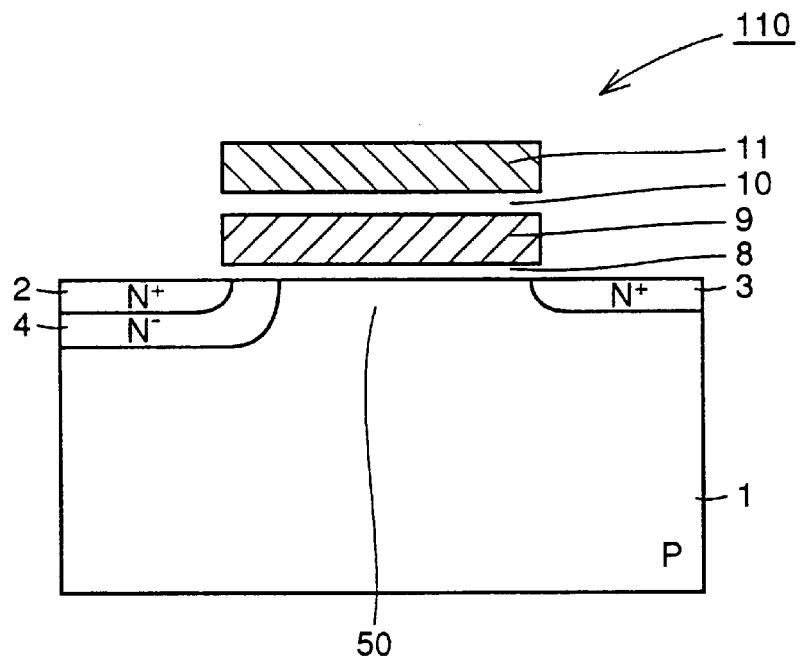
FIG. 20 is a cross section showing a memory cell portion of the conventional flash EEPROM of the DINOR type.
Figure 21:
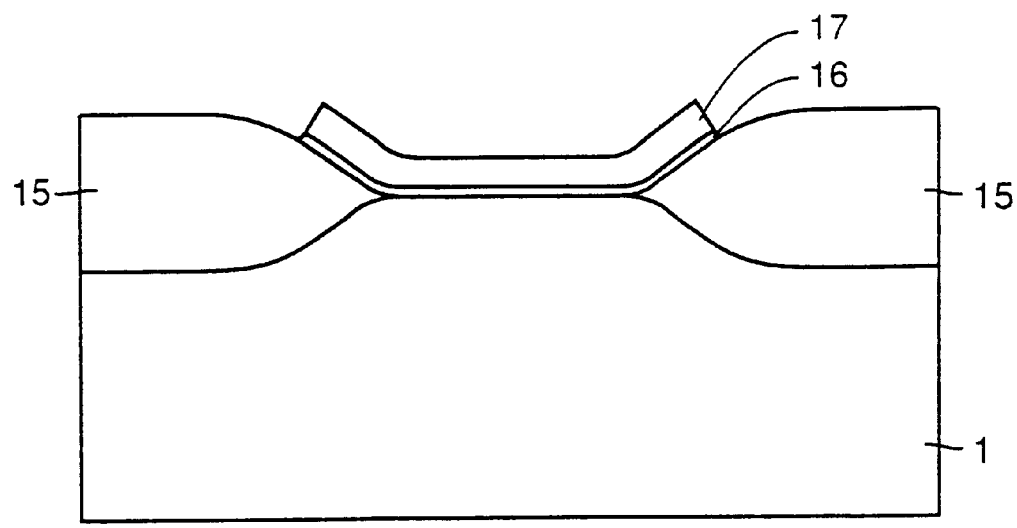
FIGS. 21 and 22 are cross sections showing 1st and 2nd steps in a process of manufacturing the memory cell portion and peripheral circuit portion of the conventional flash EEPROM of the DINOR type, respectively.
Figure 22:
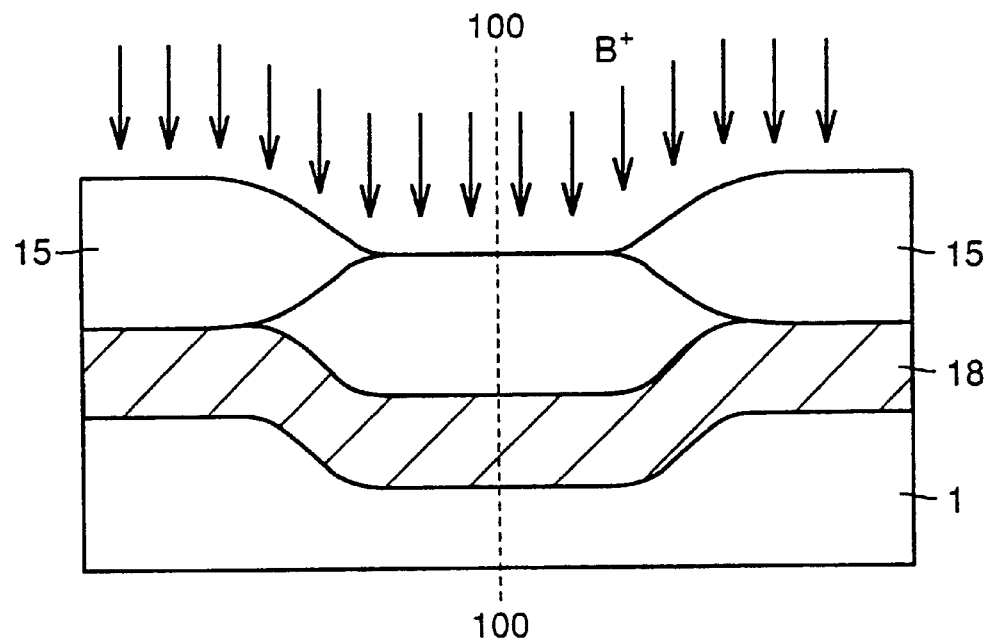
Figure 23:
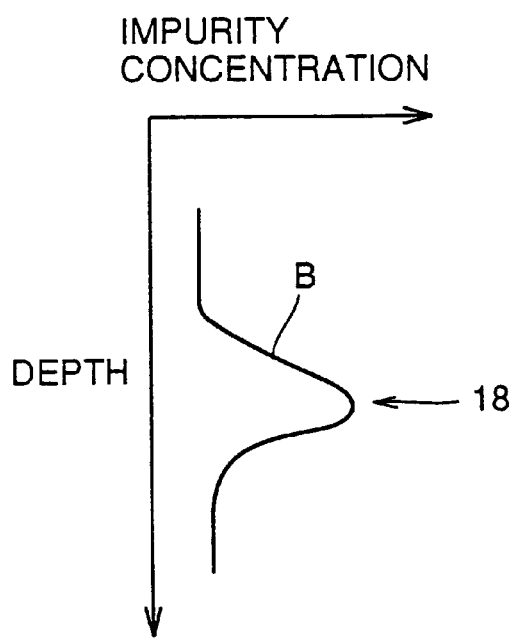
FIG. 23 shows an impurity profile taken along line 100—100 at the step shown in FIG. 22.
Figure 24:
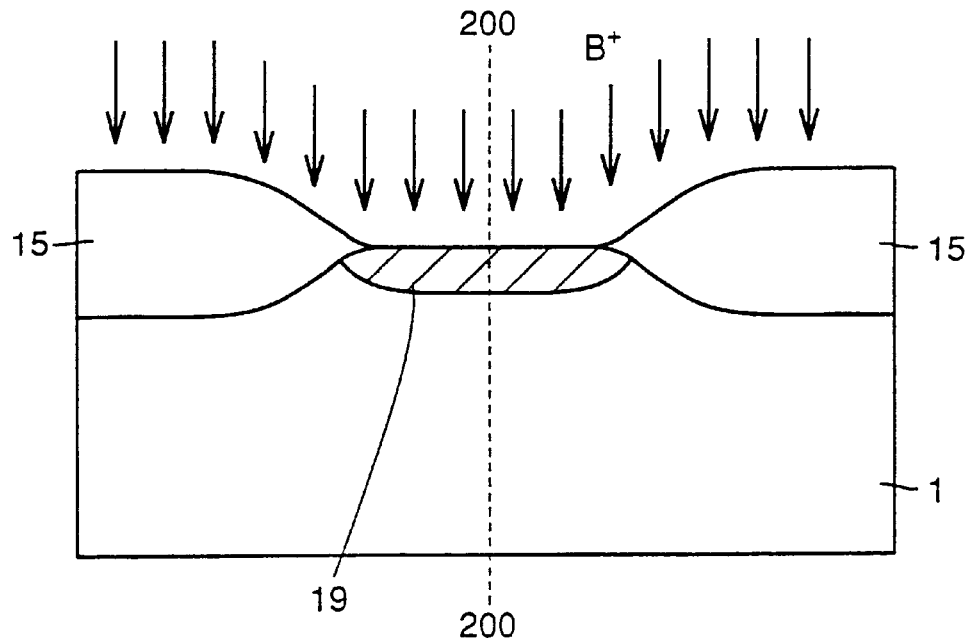
FIG. 24 is a cross section showing a 3rd step in the process of manufacturing the memory cell portion and peripheral circuit portion of the conventional flash EEPROM of the DINOR type.
Figure 25:
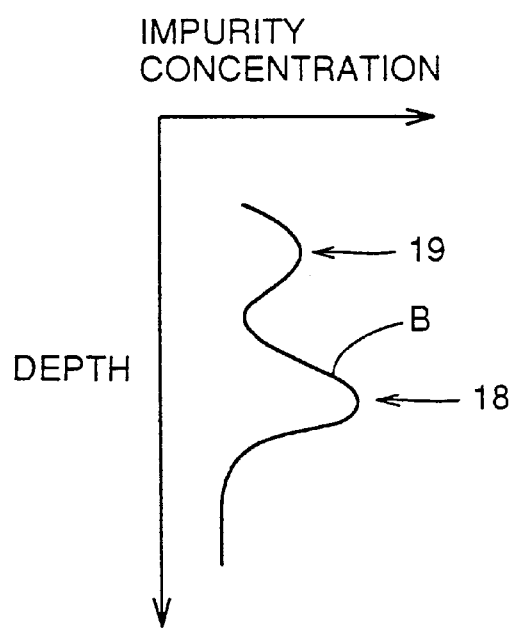
FIG. 25 shows an impurity profile taken along line 200—200 at the step shown in FIG. 24.
Figure 26:
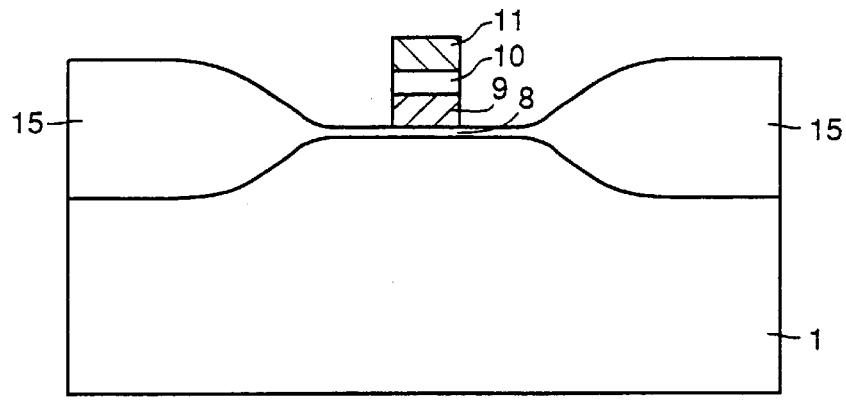
FIG. 26 is a cross section showing a 4th step in the process of manufacturing the memory cell portion of the conventional flash EEPROM of the DINOR type.
Figure 27:
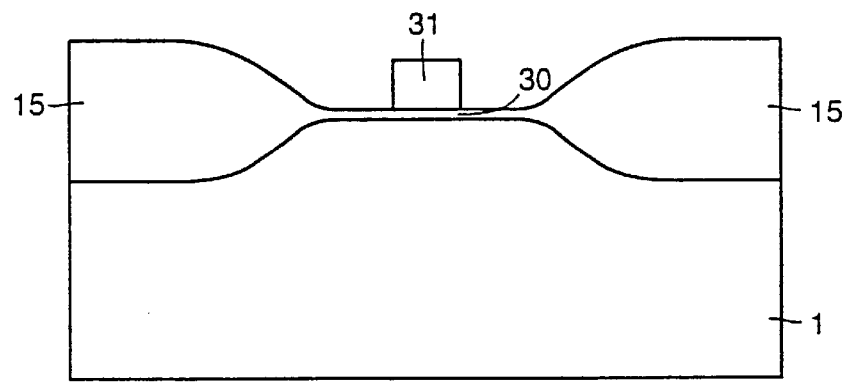
FIG. 27 is a cross section showing a 4th step in the process of manufacturing the peripheral circuit portion of the conventional flash EEPROM of the DINOR type.
Figure 28:
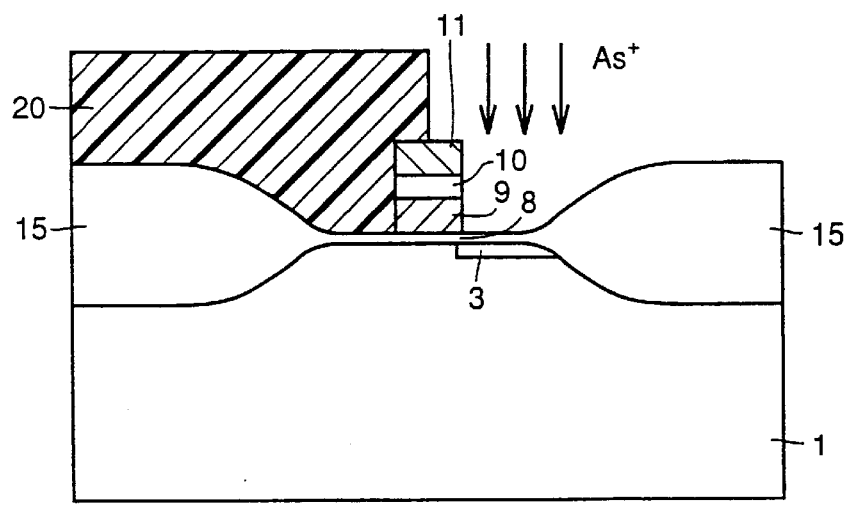
FIG. 28 and 29 are cross sections showing a 5th and 6th steps in the process of manufacturing the memory cell portion of the conventional flash EEPROM of the DINOR type, respectively.
Figure 29:
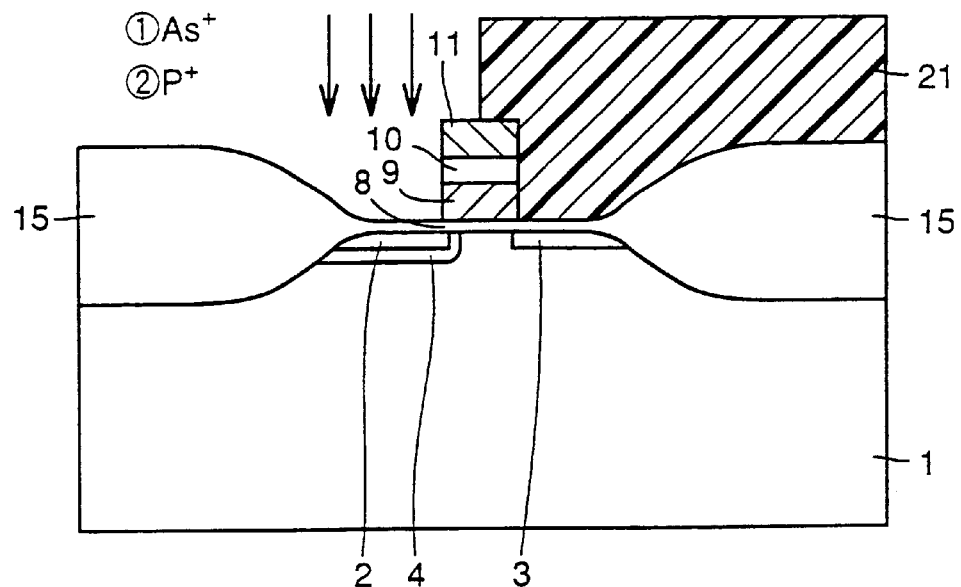
Figure 30:
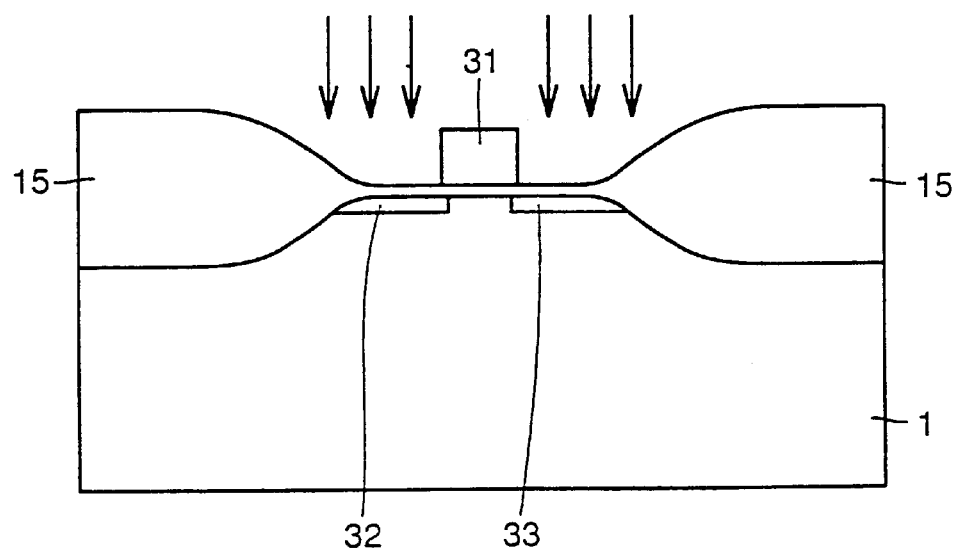
FIG. 30 is a cross section showing a 5th step in the process of manufacturing the peripheral circuit portion of the conventional flash EEPROM of the DINOR type.
Figure 31:
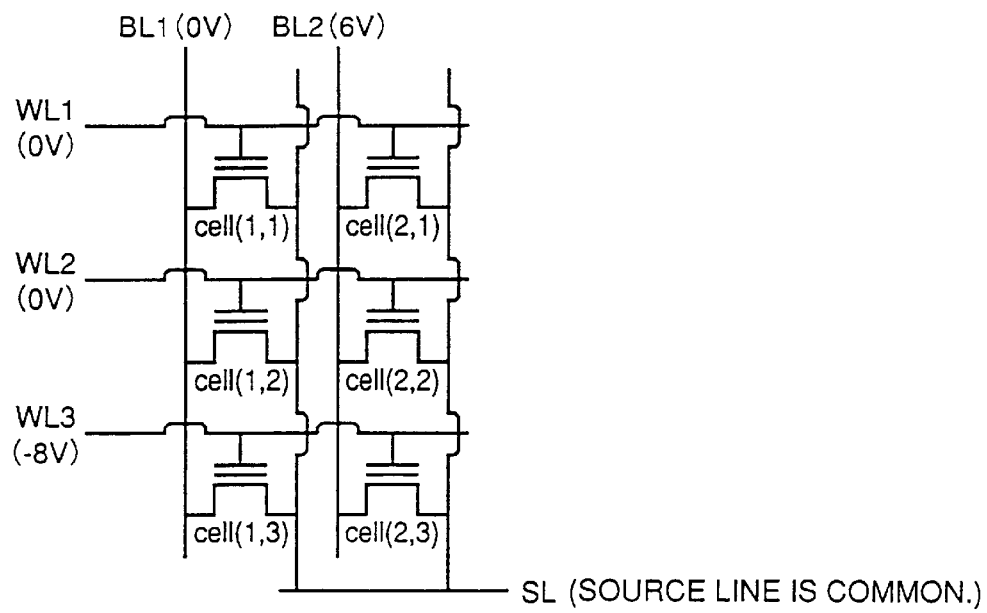
FIG. 31 schematically shows a cell array structure of the conventional flash EEPROM of the DINOR type.
Figure 32:
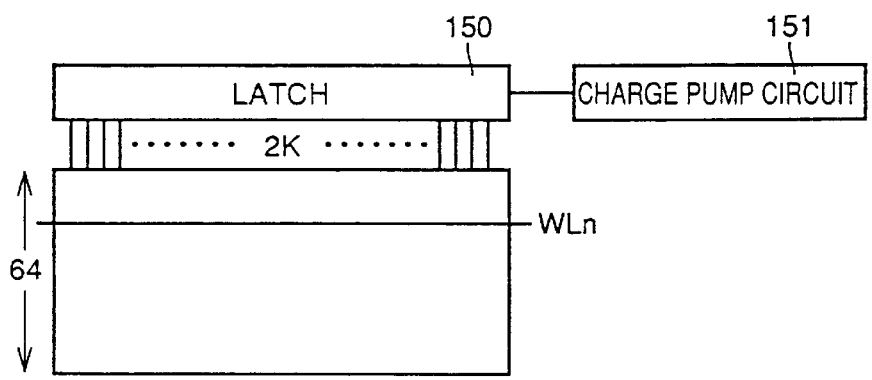
FIG. 32 is a diagram schematically showing the write operation of the conventional flash EEPROM of the DINOR type.
Figure 33:
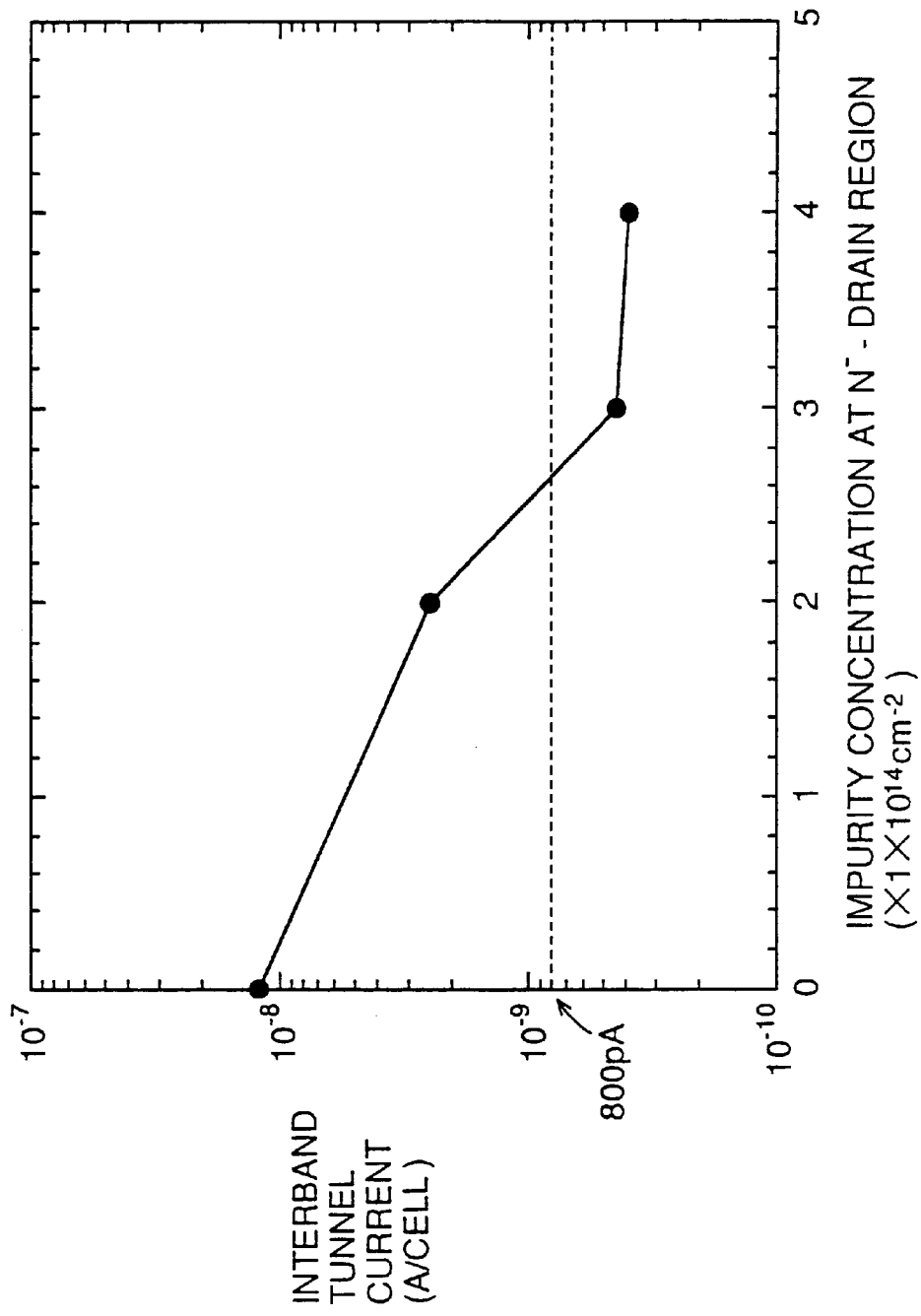
FIG. 33 is a graph showing an interband tunnel current in accordance with change of an impurity concentration at the conventional N$^-$-drain region.

As shown in FIG. 14, a resist 21 is formed to cover $N^+$-source region 3. Using resist 21 as a mask, arsenic (As) is ion-implanted into the drain formation region with the conditions of 30–60 keV and $1\times10^{15}$–$8\times10^{15}$ cm$^{-2}$, and then phosphorus (P) is ion-implanted with the conditions of 30–60 keV and $1\times10^{13}$–$1\times10^{15}$ cm$^{-2}$. Thereby, $N^+$-drain region 2 and $N^-$-drain region 4 are formed. Thereafter, resist 21 is removed. In this manner, the flash EEPROM of the DINOR type on which the channel doping was effected two times is completed. In the structure shown in FIG. 15 on which the channel doping is effected two times, the depletion layer extends or spreads as shown in FIG. 18 if 5 V is applied to the drain. It can be understood from FIG. 18 that extension of the depletion layer can be suppressed also by performing the channel doping two times with different energies. Thereby, the punch-through phenomenon can be suppressed.

According to the nonvolatile semiconductor memory device of an aspect of the invention, as described hereinbefore, the first impurity region of the second conductivity type having an impurity concentration lower than that of the drain region is formed to cover at least the drain region, and the second impurity region of the first conductivity type is formed under the first impurity region covering at least the drain region without covering a portion of the first impurity region near the channel region, whereby the punch-through phenomenon can be suppressed by the second impurity region, while suppressing the interband tunnel current (leak current) by the first impurity region.

According to the method of manufacturing the nonvolatile semiconductor memory device of another aspect of the invention, impurity of the second conductivity type is ion-implanted into the semiconductor substrate to form the first impurity region of the second conductivity type covering at least the drain region, and impurity of the first conductivity type is ion-implanted into the semiconductor substrate with an implantation angle not more than 8° with respect to the direction perpendicular to the main surface of the semiconductor substrate so that the second impurity region of the first conductivity type is formed under the first impurity region covering the drain region. Thereby, it is possible to manufacture easily the nonvolatile semiconductor memory device which can suppress the punch-through phenomenon while preventing the leak current.

According to the method of manufacturing the nonvolatile semiconductor memory device of still another aspect of the invention, the first channel doping is effected on the predetermined region in the main surface of the semiconductor substrate with the first implantation energy, and the second channel doping is effected with the second implantation energy larger than the first implantation energy, so that the impurity profile at the channel doped layer along the depth direction of the semiconductor substrate is flatter than the prior art. This reduces an area of the region of the low impurity concentration as compared with the prior art, and thus the punch-through phenomenon can be suppressed effectively.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a nonvolatile semiconductor memory device comprising the steps of:

forming a source region and a drain region of a second conductivity type on a main surface of a semiconductor substrate of a first conductivity type by ion-implanting impurity of the second conductivity type into said semiconductor substrate to define a channel region;

forming a first impurity region of the second conductivity type under at least said entire drain region by ion-implanting impurity of the second conductivity type into said semiconductor substrate, said first impurity region having an impurity concentration lower than that of said drain region; and forming a second impurity region of the first conductivity type under at least said first impurity region under said drain region by ion-implanting impurity of the first conductivity type into said semiconductor substrate with an implantation angle not more than 8° with respect to a direction perpendicular to said main surface of said semiconductor substrate, wherein the second impurity region of the first conductivity type does not extend to the main surface of the semiconductor substrate.

2. The method of manufacturing the nonvolatile semiconductor memory device according to claim 1, wherein a concentration of the impurity of the first conductivity type at said second impurity region is lower than that of the impurity of the second conductivity type at said first impurity region.

* * * * *